(12) United States Patent
Li et al.

(10) Patent No.: US 11,163,205 B1
(45) Date of Patent: Nov. 2, 2021

(54) DISPLAY MODULE AND DISPLAY DEVICE

(71) Applicant: Wuhan Tianma Micro-Electronics Co., Ltd., Wuhan (CN)

(72) Inventors: Shengming Li, Wuhan (CN); Jiang Chen, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/933,616

(22) Filed: Jul. 20, 2020

(30) Foreign Application Priority Data

May 29, 2020 (CN) .......................... 202010476390.5

(51) Int. Cl.
| | | |
|---|---|---|
| *G02F 1/1362* | (2006.01) |
| *H01L 27/32* | (2006.01) |
| *H05K 1/18* | (2006.01) |
| *H01L 51/52* | (2006.01) |
| *G02F 1/1345* | (2006.01) |

(52) U.S. Cl.
CPC .... *G02F 1/136286* (2013.01); *G02F 1/13456* (2021.01); *G02F 1/13458* (2013.01); *G02F 1/136209* (2013.01); *H01L 27/3276* (2013.01); *H01L 51/5284* (2013.01); *H05K 1/189* (2013.01); *H05K 2201/10136* (2013.01)

(58) Field of Classification Search
CPC ......... G02F 1/136286; G02F 1/136209; G02F 1/13458; G02F 1/113456; G02F 2201/42; H01L 27/3276; H01L 51/5284; H05K 1/189; H05K 2201/10136

See application file for complete search history.

(56) References Cited

U.S. PATENT DOCUMENTS

| 10,672,853 B2 * | 6/2020 | Ha ......................... H05K 1/147 |
| 2018/0335869 A1 * | 11/2018 | Watanabe ............. G06F 3/0445 |
| 2020/0264468 A1 * | 8/2020 | Park ....................... H05K 3/403 |
| 2020/0312939 A1 * | 10/2020 | Cheon ................... G02F 1/1345 |

FOREIGN PATENT DOCUMENTS

CN 106973520 A 7/2017

* cited by examiner

*Primary Examiner* — Nathanael R Briggs
(74) *Attorney, Agent, or Firm* — Anova Law Group, PLLC

(57) ABSTRACT

A display module and a display device are provided. The display module includes a main display area, an auxiliary display area, and a non-display area; a light-emitting surface; a display panel, an adapter component, and a flexible circuit board. The adapter component is disposed on a side of the substrate of the display module adjacent to the light-emitting surface and in a first non-display area. The adapter component includes a flexible substrate, a plurality of mutually insulated second pads and a plurality of mutually insulated third pads. The plurality of mutually insulated second pads and the plurality of mutually insulated third pads are all disposed on a side of the flexible substrate adjacent to the substrate; and the plurality of mutually insulated second pads are disposed on a side of the plurality of mutually insulated third pads adjacent to the main display area.

20 Claims, 20 Drawing Sheets

DISPLAY MODULE AND DISPLAY DEVICE

CROSS-REFERENCES TO RELATED APPLICATIONS

This application claims priority of Chinese Patent Application No. 202010476390.5, filed on May 29, 2020, the entire contents of which are hereby incorporated by reference.

FIELD OF THE DISCLOSURE

The present disclosure generally relates to the field of display technology and, more particularly, relates to a display module and a display device.

BACKGROUND

With the development of mobile electronic product technology, narrow bezels have been used as a selling point of display device for the electronic products to attract consumers. The bezel size of such electronic products is directly related to the bezel width of the display module.

Currently, a display product may include a flexible substrate, or a flexible circuit board bonded on a substrate, which are often bent in the lower bezel area of the display product to the back of the display panel. Multiple film layers, including wirings used to transmit signals, are usually disposed in the bending region of the flexible substrate or the flexible circuit board. When a large-angle bending of the flexible substrate or flexible circuit board occurs, the wirings may break and the display function may fail.

Therefore, there is a need to reduce the risk of the disconnection/breakage of the wirings. The disclosed display module and display device are directed to solve one or more problems set forth above and other problems in the art.

BRIEF SUMMARY OF THE DISCLOSURE

One aspect of the present disclosure provides a display module. The display module includes a main display area, an auxiliary display area, and a non-display area. The auxiliary display area includes a first auxiliary display area, the non-display area includes a first non-display area, and the main display area, the first non-display area and the first auxiliary display area are arranged along a first direction. The display module also includes a light-emitting surface; and a display panel. The display panel includes a substrate, a plurality of mutually insulated first pads are disposed on a side of the substrate adjacent to the light-emitting surface, and the plurality of first pads are disposed in the first non-display area. Further, the display module includes an adapter component. The adapter component is disposed on a side of the substrate adjacent to the light-emitting surface and in the first non-display area, the adapter component includes a flexible substrate, a plurality of mutually insulated second pads and a plurality of mutually insulated third pads, the plurality of mutually insulated second pads and the plurality of mutually insulated third pads are all disposed on a side of the flexible substrate adjacent to the substrate, and the plurality of mutually insulated second pads are disposed on a side of the plurality of mutually insulated third pads adjacent to the main display area. Further, the display module includes a flexible circuit board. The flexible circuit board is disposed on a side of the substrate away from the light-emitting surface, and the flexible circuit board in the first non-display area includes a plurality of mutually insulated fourth pads. The plurality of first pads and the plurality of second pads are electrically connected in one-to-one correspondence, the plurality of second pads and the plurality of third pads are electrically connected in one-to-one correspondence, and the plurality of third pads and the plurality of fourth pads are electrically connected in one-to-one correspondence.

Another aspect of the present disclosure provides a display device. The display device includes a display module. The display module includes a main display area, an auxiliary display area, and a non-display area. The auxiliary display area includes a first auxiliary display area, the non-display area includes a first non-display area, and the main display area, the first non-display area and the first auxiliary display area are arranged along a first direction. The display module also includes a light-emitting surface; and a display panel. The display panel includes a substrate, a plurality of mutually insulated first pads are disposed on a side of the substrate adjacent to the light-emitting surface, and the plurality of first pads are disposed in the first non-display area. Further, the display module includes an adapter component. The adapter component is disposed on a side of the substrate adjacent to the light-emitting surface and in the first non-display area, the adapter component includes a flexible substrate, a plurality of mutually insulated second pads and a plurality of mutually insulated third pads, the plurality of mutually insulated second pads and the plurality of mutually insulated third pads are all disposed on a side of the flexible substrate adjacent to the substrate, and the plurality of mutually insulated second pads are disposed on a side of the plurality of mutually insulated third pads adjacent to the main display area. Further, the display module includes a flexible circuit board. The flexible circuit board is disposed on a side of the substrate away from the light-emitting surface, and the flexible circuit board in the first non-display area includes a plurality of mutually insulated fourth pads. The plurality of first pads and the plurality of second pads are electrically connected in one-to-one correspondence, the plurality of second pads and the plurality of third pads are electrically connected in one-to-one correspondence, and the plurality of third pads and the plurality of fourth pads are electrically connected in one-to-one correspondence.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrating embodiments of the present disclosure, and together with the detailed descriptions serve to explain the mechanism of the present disclosure. Obviously, the drawings in the following description are only exemplary embodiments of the present disclosure. For those of ordinary skill in the art, without paying creative labor, other drawings can be obtained according to the provided drawings.

DETAILED DESCRIPTION

Figure 1:
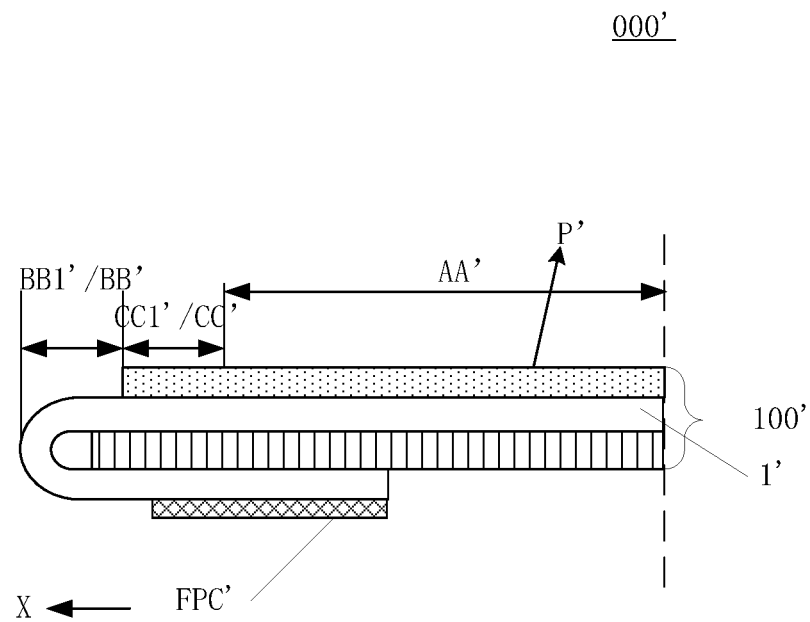
FIG. 1 illustrates a cross-sectional view of a display module.

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure.

The following description of at least one exemplary embodiment is actually merely illustrative, and in no way serves as any limitation on the disclosure and its application or use.

Techniques, methods and equipment known to those of ordinary skill in the related art may not be discussed in detail, but where appropriate, the techniques, methods and equipment should be considered as part of the specification.

In all examples shown and discussed herein, any specific values should be interpreted as merely exemplary and not limiting. Therefore, other examples of the exemplary embodiment may have different values.

It should be noted that similar reference numerals and letters indicate similar items in the following drawings, therefore, once an item is defined in one drawing, there is no need to discuss it further in subsequent drawings.

To solve the disconnection problem caused when the flexible substrate or the flexible circuit board is bent at a large angle, the following research has been conducted on the display module.

Figure 2:
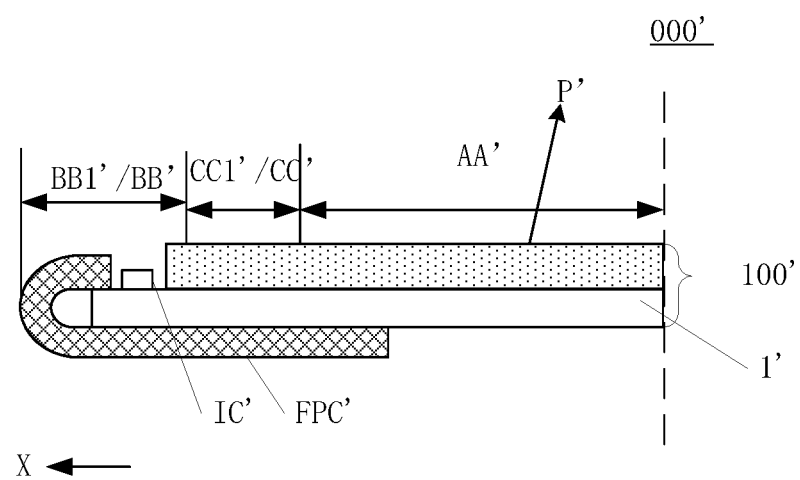
FIG. 2 illustrates a cross-sectional view of another display module.
Figure 3:
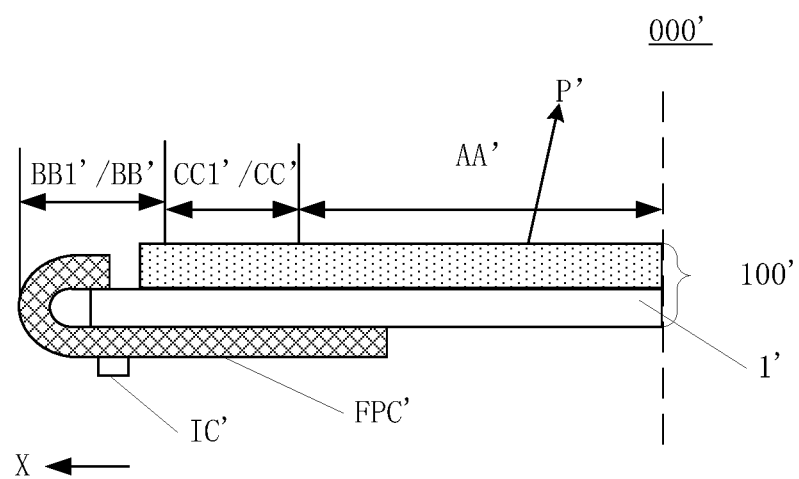
FIG. 3 illustrates a cross-sectional view of another display module.

FIG. 1 illustrates a cross-sectional view of a display module. FIG. 2 illustrates a cross-sectional view of another display module. FIG. 3 illustrates a cross-sectional view of another display module.

As shown in FIG. 1, the display module 000' includes a main display area AA', an auxiliary display area CC' and a non-display area BB'. The non-display area BB' includes a first non-display area BB1', and the auxiliary display area CC' includes a first auxiliary display area CC1'. The main display area AA', the first auxiliary display area CC1', and the first non-display area BB1' are arranged along a first direction X. The display module 000' has a light-emitting surface P', and the display module 000' includes a display panel 100'. The display panel 100' includes a substrate 1'. The substrate 1'*is* not pattern-filled in FIG. 1. The display panel 100' also includes other film layers on a side of the substrate 1' adjacent the light-emitting surface P' and other film layers on the side of the substrate 1'away from the light-emitting surface P'. Metal wirings are disposed on the substrate 1'. To achieve a narrow bezel, the substrate 1' is usually a flexible substrate, and the substrate 1' is bent to the back of the display panel 100' in the first non-display area. As shown in FIG. 1, during the bending process, due to a large bending angle or a large number of bending times, there is a risk that the metal wirings on the base substrate 1' are broken. The display failure occurs. In FIG. 2 and FIG. 3, the flexible circuit board FPC' is boned in the first non-display area BB1' of the display panel 100', and then the flexible circuit board FPC' is bent to the back of the display panel 100'. The driving IC chip in FIG. 2 is bounded on the substrate 1', and the driving IC chip in FIG. 3 is bonded on the flexible circuit board FPC'. As shown in FIGS. 2-3, due to the large bending angle, the metal wirings on the flexible circuit board FPC' also have the risk of breakage of wirings, resulting in a display failure.

To solve the above technical problems and other issues, the present disclosure provides a display module and a display device. The embodiments of the display module and the display device provided by the present disclosure will be described in detail below.

Figure 4:
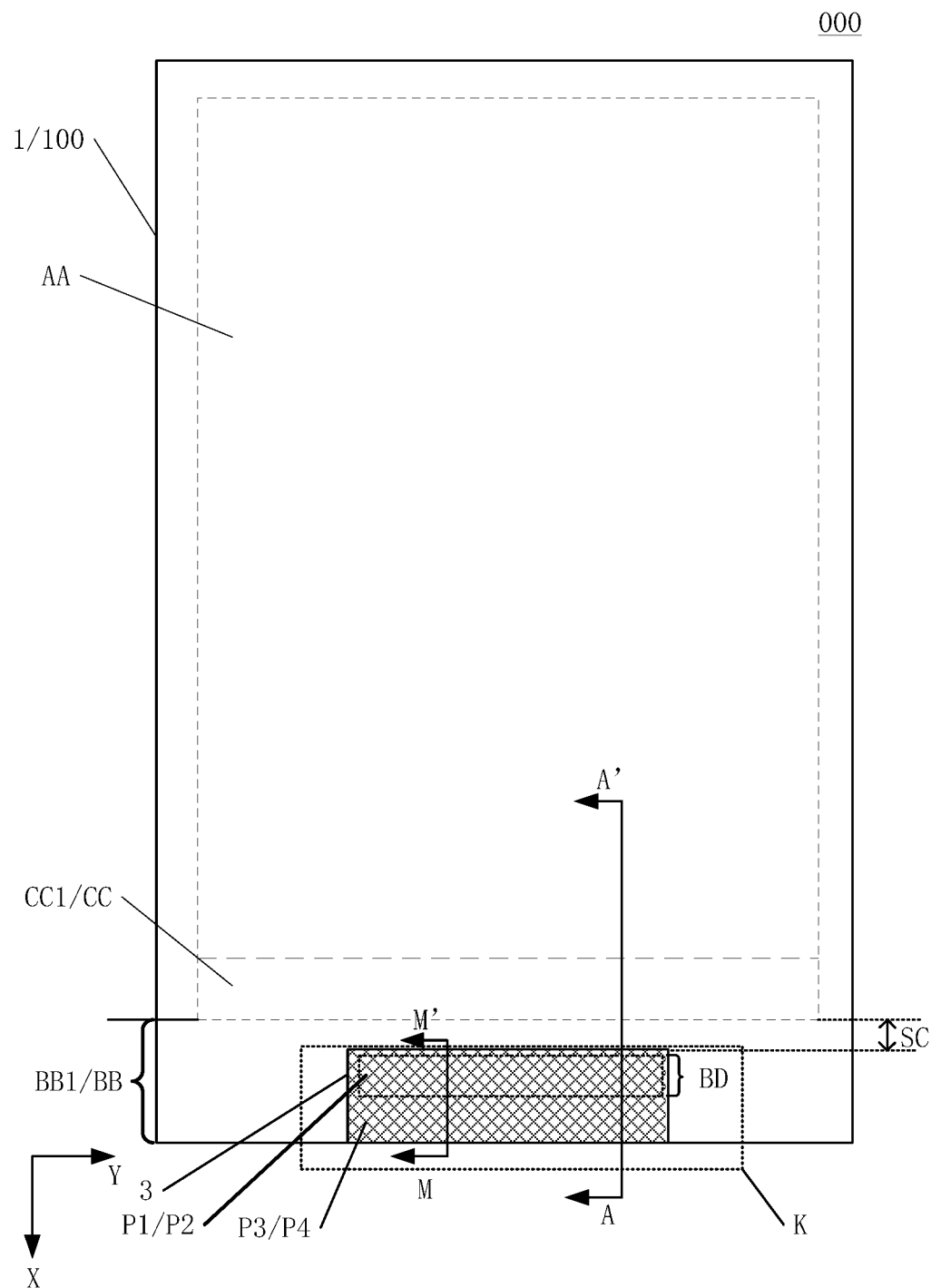
FIG. 4 illustrates a top view of an exemplary display module consistent with various disclosed embodiments of the present disclosure.
Figure 5:
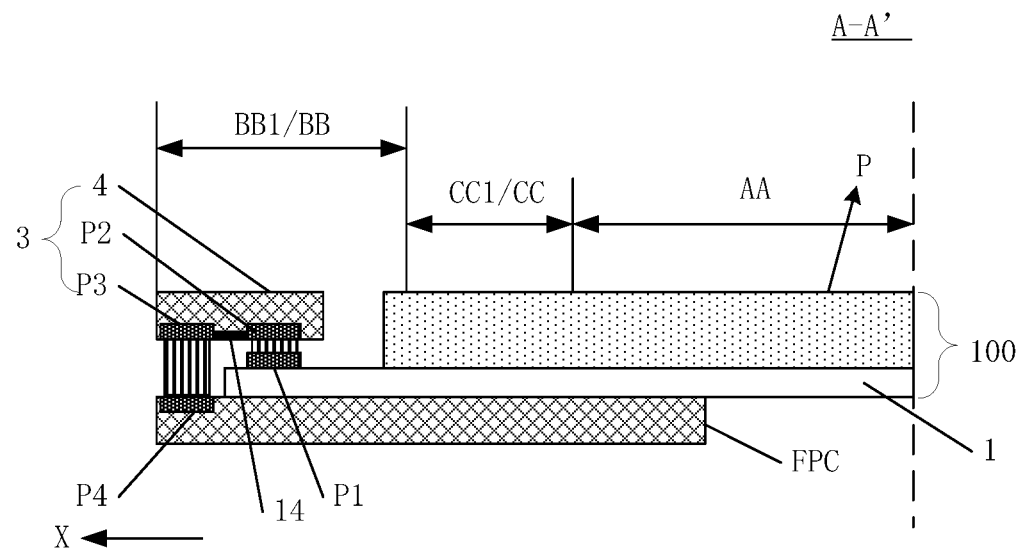
FIG. 5 illustrates an A-A'-sectional view in FIG. 4.

FIG. 4 illustrates a schematic top view of a display module consistent with various disclosed embodiments of the present disclosure. FIG. 5 is an A-A' sectional view in FIG. 4, and FIG. 6 illustrates the structure in shown in FIG. 5 under a bent state.

Figure 6:
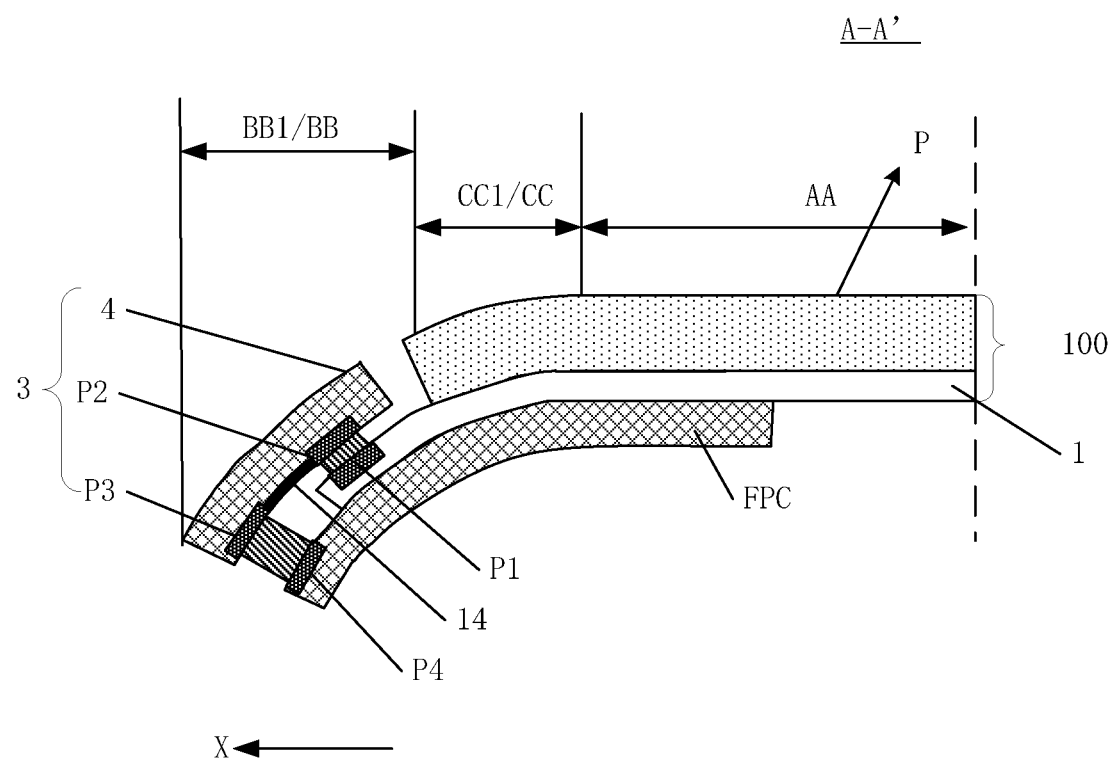
FIG. 6 illustrates the structure in FIG. 5 under a bent state.

As shown in FIGS. 4-6, the display module 000 may include a main display area AA, an auxiliary display area CC, and a non-display area BB. The auxiliary display area CC may include a first auxiliary display area CC1. The non-display area BB may include a first non-display area BB1. The first non-display area BB11, the first auxiliary display area CC1 and the main display area AA may be arranged along a first direction X. The display module 000 may include a light-emitting surface P.

FIG. 4 only shows the case where the auxiliary display area CC has the first auxiliary display area CC1. It can be understood that the main display area AA and the auxiliary display area CC may jointly display the complete screen. For example, the main display area AA may be used to display the main screen, and the auxiliary display area CC may be used to display the auxiliary screen. Compared with the prior art which only includes the main display area AA, by setting the auxiliary display area CC, the display area of the display module may be increased, and more images may be displayed.

In some embodiments, as shown in FIG. 6, the auxiliary display area CC may be located on the side of the display module such that the main display area AA may be displayed on the flat area of the display module, and the auxiliary display area CC may be disposed on the side of the display module. Thus, the screen-to-body ratio may be improved; and a full-screen display may be achieved.

Referring to FIG. 4, the display module 000 may further include a display panel 100, an adapter component 3, and a flexible circuit board FPC.

As shown in FIGS. 4-5, the display panel 100 may include a substrate 1. One side of the substrate 1 adjacent to the light-emitting surface P may be provided with a plurality of first pads P1 insulated from each other; and the first pads P1 may be disposed on the first non-display area BB1.

The adapter component 3 may be disposed on the side of the substrate 1 adjacent to the light-emitting surface P and located in the first non-display area BB1. The adapter component 3 may include a flexible substrate 4, a plurality of mutually insulated second pads P2, and a plurality of mutually insulated third pads P3. The second pads P2 and the third pads P3 may be located on the side of the flexible substrate 4 adjacent to the substrate 1. The second pads P2 may be located at the side of the third pads P3 adjacent to the main display area AA.

The flexible circuit board FPC may be located on the side of the substrate 1 away from the light-emitting surface P. The portion of the flexible circuit board FPC located in the first non-display area BB1 may include a plurality of mutually insulated fourth pads P4.

The first pads P1 and the second pads P2 may be electrically connected in one-to-one correspondence. The second pads P2 and the third pads P3 may be electrically connected in one-to-one correspondence. The third pads P3 and the fourth pads P4 may be electrically connected in one-to-one correspondence.

It can be understood that the substrate 1 of the present disclosure may be a glass substrate, or a flexible substrate. When the substrate 1 is a flexible substrate, the display module 000 may be a flexible display module 000. The flexible substrate may be any suitable flexible insulating material. The flexible substrate may be transparent, translucent, or opaque.

Referring to FIG. 6, the display module 000 may be a flexible display module 000. When the display module 100 is formed, it can be physically pressed to bend the flat display module in FIG. 5 into the curved display module as shown in FIG. 6. In one embodiment, the first non-display area BB1 and the first auxiliary display area CC1 may be bent toward the side facing away from the light-emitting surface P of the display panel 100. The curved display module may be applied to more application scenarios, and the user experience may be improved.

In some embodiments, referring to FIG. 4, the first non-display area BB1 may further include a bonding area BD and a fan-out line area SC in the display panel 100. The first bonding area BD may be disposed with the plurality of first pads P1. The fan-out line area SC may include a plurality of fan-out lines. The display panel 100 may further include a plurality of data lines extending along the first direction X and a plurality of scanning lines extending along a second direction Y (not shown in the figure). The display panel 100 may also include shift registers (not shown) at both sides. The scan lines may be electrically connected to the shift registers. The shift registers and data lines may be electrically connected to the first pads P1 through the fan-out lines in the fan-out area SC. The first pads P1 may be electrically connected to the data lines to provide data voltage signals for the data lines. The first pads P1 may be electrically connected to the shift registers to provide scan signals to the scan lines through the shift registers.

Compared with the prior art, the display module of the present disclosure may have at least the following beneficial effects.

The present disclosure may realize the connection between the signal lines of the display panel 100 and the flexible circuit board FPC by providing the adapter component 3. Compared with FIG. 1 to FIG. 3, the substrate or the flexible circuit board may be prevented from being bent at a large angle. The issue of wiring breakage caused by bending the substrate and/or the flexible circuit board at a large angle may be solved, and the display reliability may be improved.

In some embodiments, the material of the flexible substrate 4 may include polyimide, or polyethylene terephthalate, etc. Polyimide (PI) is one of the most comprehensive organic polymer materials. Its high temperature resistance may be above 400° C., the long-term use temperature range may be in a range of approximately −200° C.-300° C. Polyimide may also have excellent mechanical properties, and high radiation resistance. Polyethylene terephthalate (PET) may have excellent physical and mechanical properties in a wide temperature range; and its long-term use temperature may reach 120° C. Further, PET may have excellent electrical insulation, even at high temperature and high frequency, its electrical properties may be still acceptable and its creep resistance, fatigue resistance, friction resistance and dimensional stability may still be particularly good. Polyimide and polyethylene terephthalate may have excellent physical properties and may be made thinner. The flexible substrate 4 of the adapter component 3 made of polyimide or polyethylene terephthalate may have desired physical properties, and also the overall thickness of the display module may not be increased.

Figure 7:
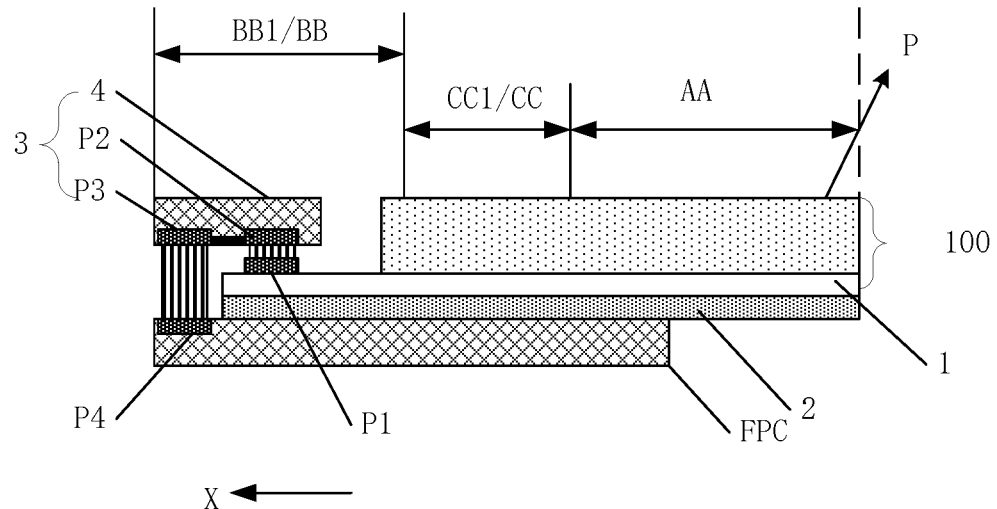
FIG. 7 illustrates another A-A'-sectional view in FIG. 4.
Figure 8:
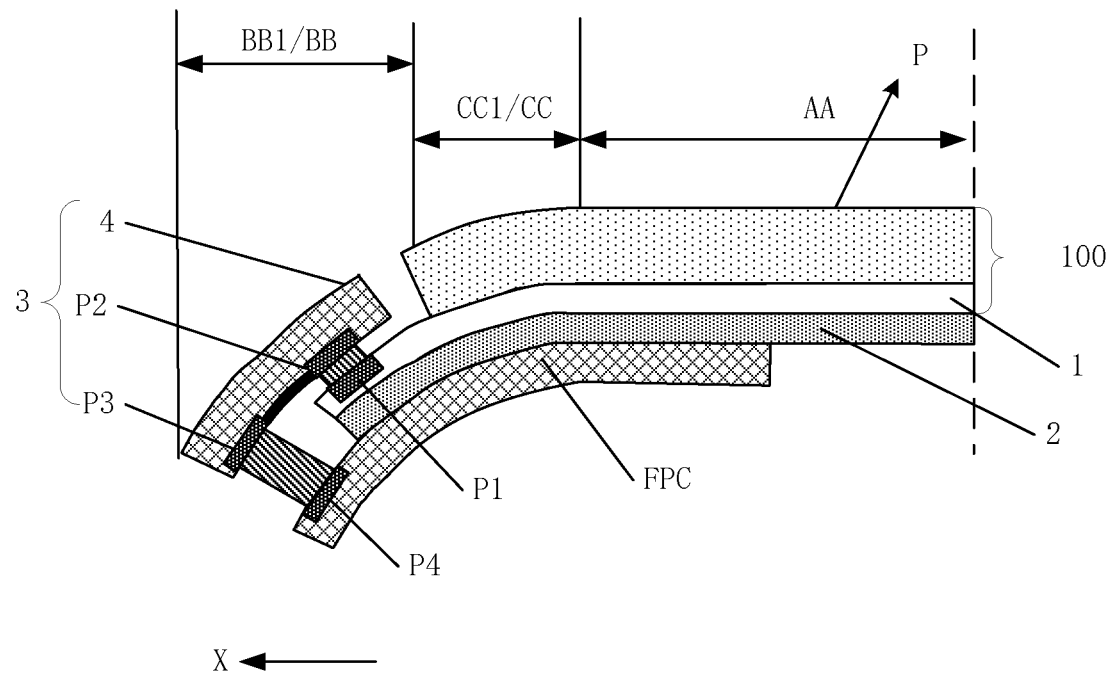
FIG. 8 illustrates the structure in FIG. 7 under a bent state.

FIG. 7 is another A-A-sectional view in FIG. 4, and FIG. 8 is a schematic view of FIG. 7 under a bent state. As shown in FIGS. 7-8, the display module may further include a protective layer 2. The protective layer 2 may be disposed on the side of the substrate 1 away from the light-emitting surface P. The flexible circuit board FPC may be attached to the side of the protective layer 2 away from the display panel 100.

In particular, in one embodiment, the protective layer 2 may be disposed on the side of the substrate 1 away from the light-emitting surface P, and may play a role in buffering and protecting when the display module is impacted or subjected to external forces. Accordingly, the use life of the display module may be increased. Further, when the display module is the curved display module as shown in FIG. 8, it may also be possible to achieve uniform stress between the pressing mold and the display module during the manufacturing process to avoid the edge curling of the display panel edge. Thus, the adverse effect on the performance of the display panel may be avoided.

In some embodiments, the material of the protective layer 2 may include polyimide, or polyethylene terephthalate, etc. The excellent mechanical properties of polyimide or polyethylene terephthalate may better protect the display panel, and support the display panel.

Figure 9:
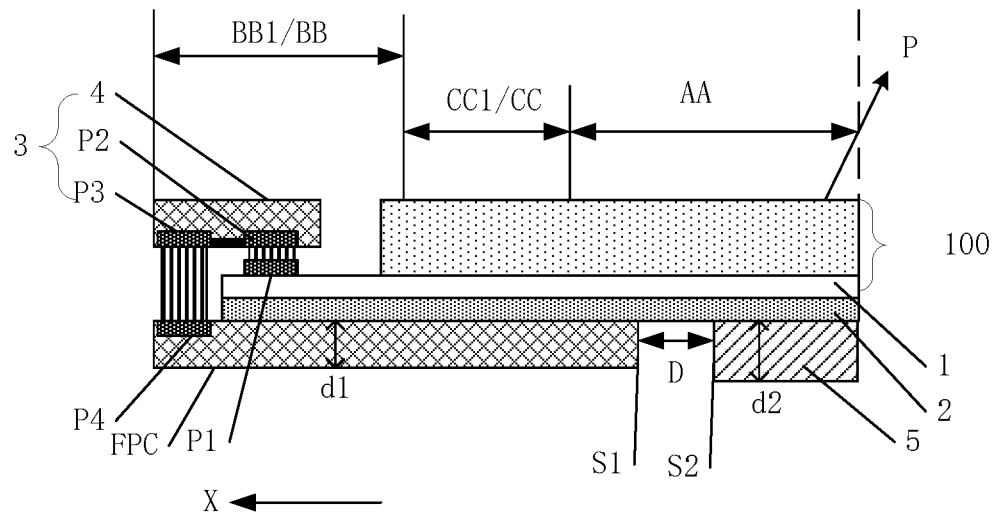
FIG. 9 illustrates another A-A'-sectional view in FIG. 4.
Figure 10:
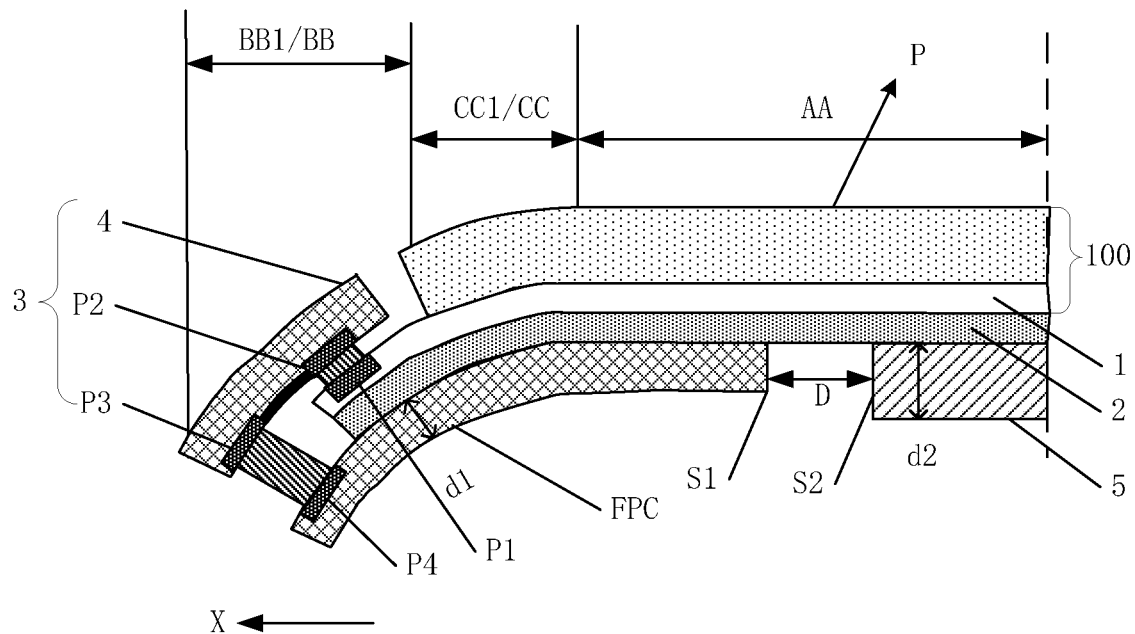
FIG. 10 illustrates the structure in FIG. 9 under a bent state.

FIG. 9 is another A-A-sectional view in FIG. 4, and FIG. 10 is a schematic view of the structure in FIG. 9 under a bent state. As shown in FIGS. 9-10, the display module may further include a first buffer layer 5. The first buffer layer 5 may be located on the side of the protective layer 2 away from the substrate 1. The flexible circuit board FPC may be disposed on a same layer as the first buffer layer 5, and the flexible circuit board FPC and the first buffer layer 5 may have a first gap D in between.

It can be understood that the same layer here means that both the flexible circuit board FPC and the first buffer 5 may be located on the side of the protective layer 2 away from the substrate 1, and may be in contact with the protective layer 2. The first buffer layer 5 and the flexible circuit board FPC in FIGS. 9-10 may not overlap but have the first gap D. The distance of the first gap D may be greater than zero. The distance of the first gap D herein may refer to as the distance between the edge 51 of the flexible circuit board FPC adjacent to the first buffer layer 5 and the edge S2 of the first buffer layer 5 adjacent to the flexible circuit board FPC. In particular, the distance of the first gap D may be the minimum distance between the flexible circuit board FPC and the first buffer layer 5. It can be understood that regardless of whether the display module is under a flat state or a curved state, the edge 51 of the flexible circuit board FPC adjacent to the first buffer layer 5 and the edge S2 of the first buffer layer 5 adjacent to the flexible circuit board FPC may still have a certain distance. When manufacturing the display module, the flexible circuit board FPC may be bonded later, and there may be an assembly tolerance between the flexible circuit board FPC and the first buffer layer 5. The first gap D herein may make the assembly tolerance within a controllable range and may not cause the flexible circuit board FPC to be pressed by the first buffer layer 5 during the bonding process.

It can be understood that the thickness of the flexible circuit board FPC may be uniform everywhere.

Further, it can be understood that the flexible circuit board FPC may be attached to the side of the protective layer 2 away from the light-emitting surface P. The flexible circuit board FPC may have a certain thickness. Because the thickness of the flexible circuit board FPC itself and the protective layer 2 may have a certain height difference, in the subsequent assembly process, the substrate 1 may be unevenly stressed, resulting in abnormal display. In one embodiment, providing the first buffer layer 5 on the side of the protective layer 2 away from the substrate 1 may reduce the uneven stress on the substrate 1 during the assembly process, and reduce the display abnormality. Further, when the display module is impacted or subjected to external forces, the first buffer layer 5 may play a buffering role to reduce the phenomenon of broken screen.

In other embodiments, referring to FIGS. 9-10, the flexible circuit board FPC may have a first thickness d1, and the first buffer layer 5 may have a second thickness d2. The first thickness d1 may be smaller than the second thickness d2. The first thickness d1 may also be equal to the second thickness d2.

It can be understood that when the first thickness d1 of the flexible circuit board FPC is equal to the second thickness d2 of the first buffer layer 5, the uneven stress on the flexible circuit board FPC may be reduced, and the disconnection of wirings may be avoided. When the first thickness d1 of the flexible circuit board FPC is smaller than the second thickness d2 of the first buffer layer 5, there may be a step difference between the flexible circuit board FPC and the first buffer layer 5. Thus, a space may be reserved for the arrangement of other film layers or components.

Further, in some embodiments, referring to FIGS. 9-10, the material of the first buffer layer 5 may include foam. Foam is a material that has been foamed by plastic particles. It has a series of characteristics, such as high elasticity, light weight, fast pressure-sensitive fixing, easy to use, flexible bending, ultra-thin volume, reliable performance, etc. Thus, the buffer layer 5 made of foam may be able to better to protect and buffer the flexible circuit board FPC and the display panel.

Figure 11:
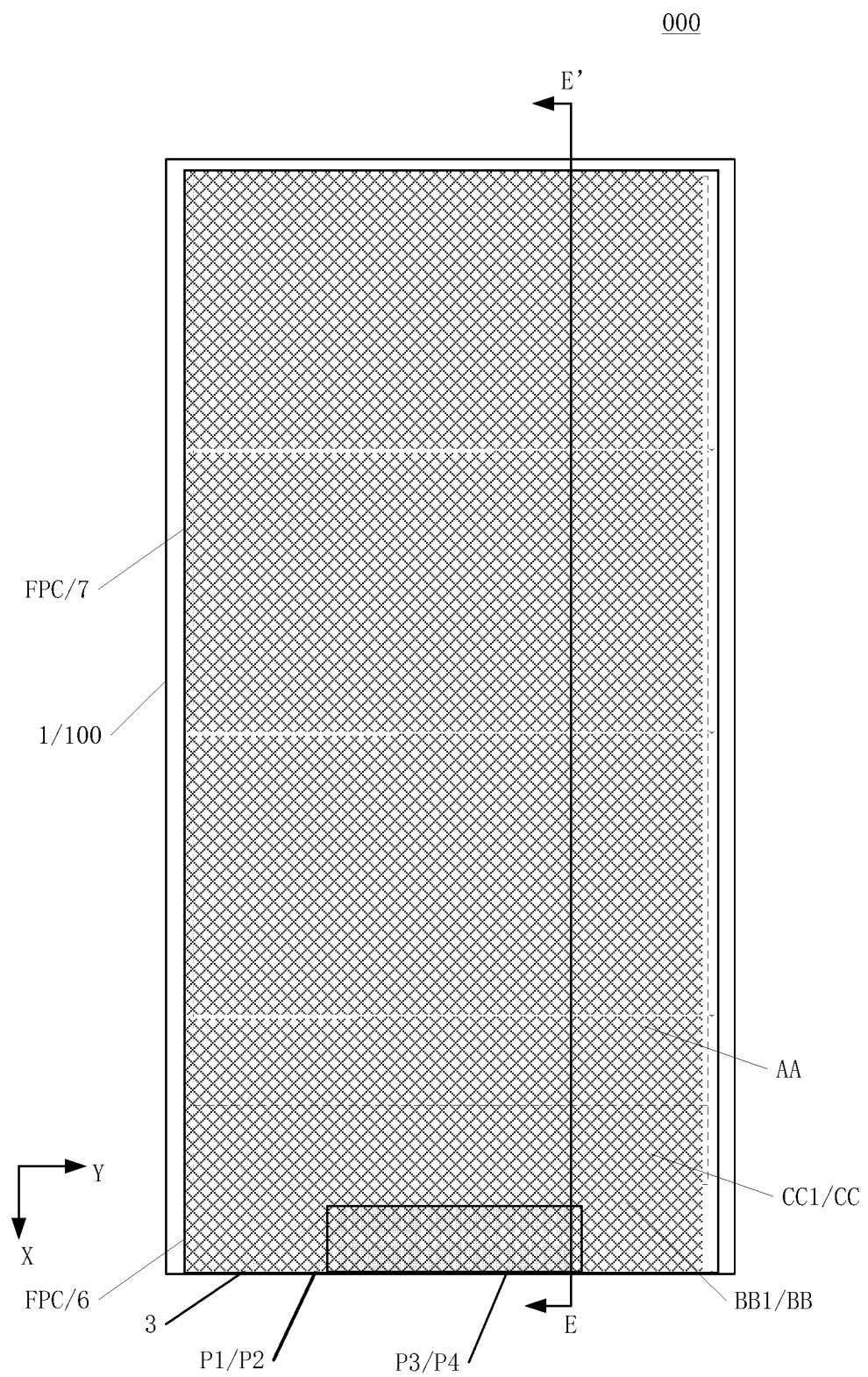
FIG. 11 illustrates a top view of another exemplary display module consistent with various disclosed embodiments of the present disclosure.
Figure 12:
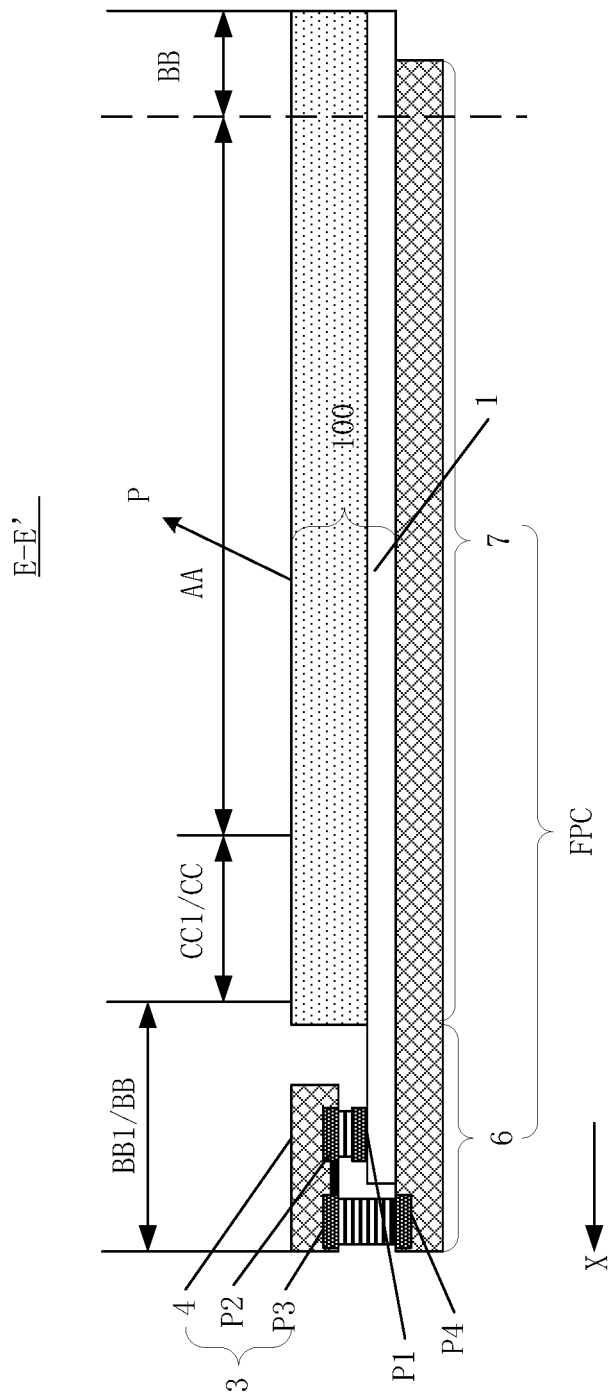
FIG. 12 illustrates an E-E'-sectional view in FIG. 11.
Figure 13:
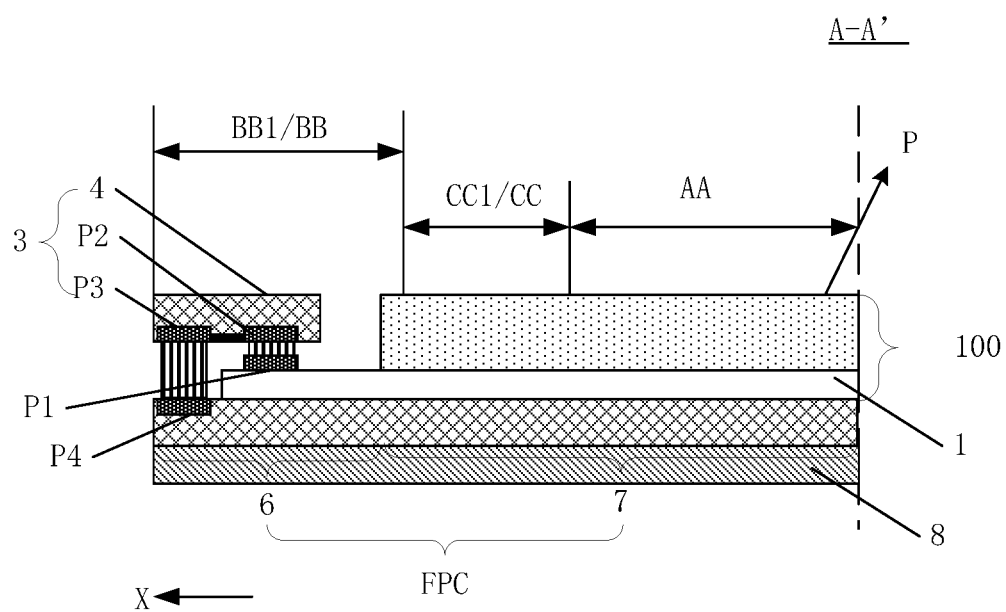
FIG. 13 illustrates another A-A'-sectional view in FIG. 4.

FIG. 11 is a schematic top view of another exemplary display module consistent with various disclosed embodiments of the present disclosure, and FIG. 12 is an E-E'-sectional view in FIG. 11. As shown in FIGS. 12-13, in some embodiments, the flexible circuit board FPC may include a first sub-portion 6 and a second sub-portion 7. The first sub-portion 6 may be located in the first non-display area BB1 and the side of the first sub-portion 6 adjacent to the light-emitting surface P may be provided with the fourth pads P4. The second sub-section 7 may be located in the main display area AA and the auxiliary display area CC.

Referring to FIG. 11, it can be seen that the flexible circuit board FPC may cover the main display area AA and the auxiliary display area CC.

In one embodiment, the flexible circuit board FPC may completely cover the substrate 1. On the one hand, the first sub-portion 6 of the flexible circuit board FPC may be located in the first non-display area BB1, and the second sub-portion 7 may be located in the main display area AA and the auxiliary display area CC. Attaching the second sub-portion 7 to the substrate 1 may compensate the step difference between the first sub-portion 6 and the substrate 1. Accordingly, when the display module is assembled with other components, the force on the substrate 1 at different positions may be uniform; and the uneven display problem caused by the uneven force on the substrate 1 may be reduced.

Further, when the display module is the curved display module as shown in FIG. 12, the substrate 1 may be more likely to be curled due to stress during the bending process. In one embodiment, the area of the flexible circuit board FPC may be increased to include the first sub-portion 6 located in the first non-display area BB1 and the second sub-portion 7 located in the main display area AA and the auxiliary display area CC (in one embodiment, as shown in FIGS. 11-12, the second sub-portion 7 may be located in the main display area AA and the auxiliary display area CC1) such that the physical properties of the flexible circuit board FPC itself may be used to support the substrate 1, and the curling of the display module during the bending process may be prevented.

Figure 14:
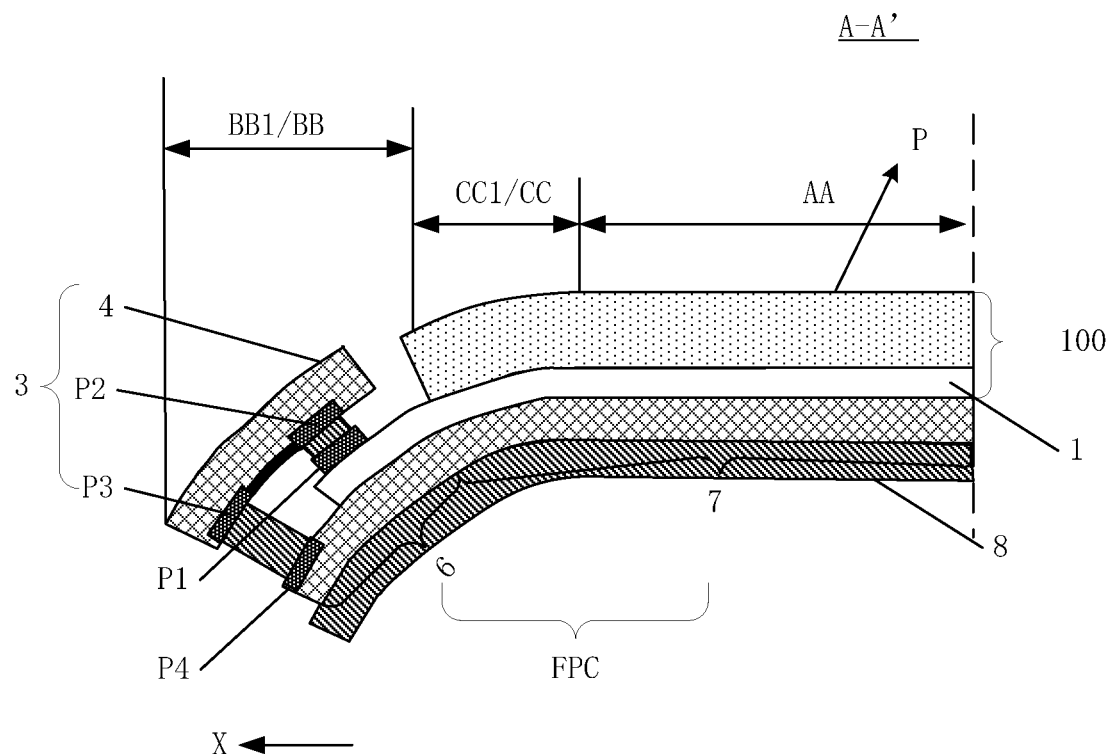
FIG. 14 illustrates the structure in FIG. 13 under a bent state.

FIG. 13 is another A-A'-sectional view in FIG. 4, and FIG. 14 is a schematic view the structure in FIG. 13 under a bent state. As shown in FIGS. 13-14, a second buffer layer 8 may be disposed on the side of the second sub-portion 7 away from the substrate 1. In some embodiments, the material of the second buffer layer 8 may include foam.

The second sub-portion 7 in FIG. 13 and FIG. 14 may be provided with a second buffer layer 8 on the side away from the base substrate 1. It can be understood that the second buffer layer 8 may play a buffering role when the display module is impacted or subjected to external forces. Thus, the service life of the display module may be increased. The flexible circuit board FPC may include circuits, and the second buffer layer 8 may also reduce the impact of external forces on the flexible circuit board FPC to protect the circuits on the flexible circuit board FPC. Thus, the reliability of the display module may be improved.

The foam may have high elasticity. Using the foam as the second buffer layer 8 may well play the role of buffering and protecting the circuit.

In some embodiments, referring to FIGS. 6, 8, 10, 12, and 14, the auxiliary display area CC may be curved away from the light-emitting surface P.

FIGS. 6, 8, 10, 12, and 14 only show that the first auxiliary display area CC1 is curved away from the light-emitting surface P. In other embodiments, all the auxiliary display area CC may be curved away from the light-emitting surface P.

The display module in the present disclosure may have a main display area AA and an auxiliary display area CC. The auxiliary display area CC may be bent along a direction away from the light-emitting surface P such that the auxiliary display area CC may realize the display on the side of the display module. Thus, the display module 000 may achieve a full-screen display effect and a side display effect to meet user needs.

It can be understood that the adapter component 3 provided in the present disclosure may be applicable to any type of display module. In particular, it may be applied to a flat display module, or a curved display module.

In the present disclosed display module, the main display area AA may be used to display the main screen, and the auxiliary display area CC may be used to display the auxiliary screen. Thus, the viewable area may be increased, and the customer's visual experience may be improved.

Figure 15:
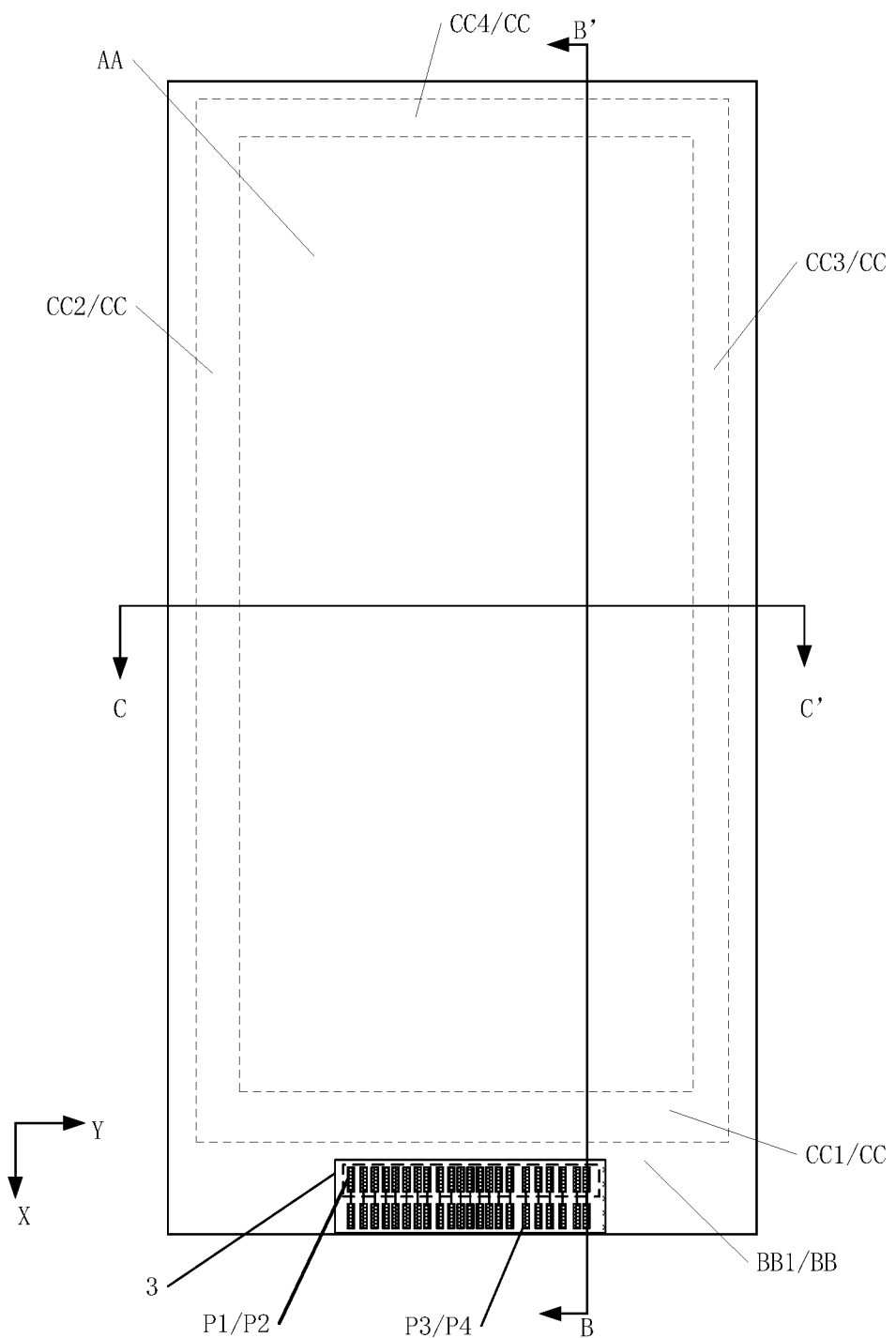
FIG. 15 illustrates a top view of another exemplary display module consistent with various disclosed embodiments of the present disclosure.
Figure 16:
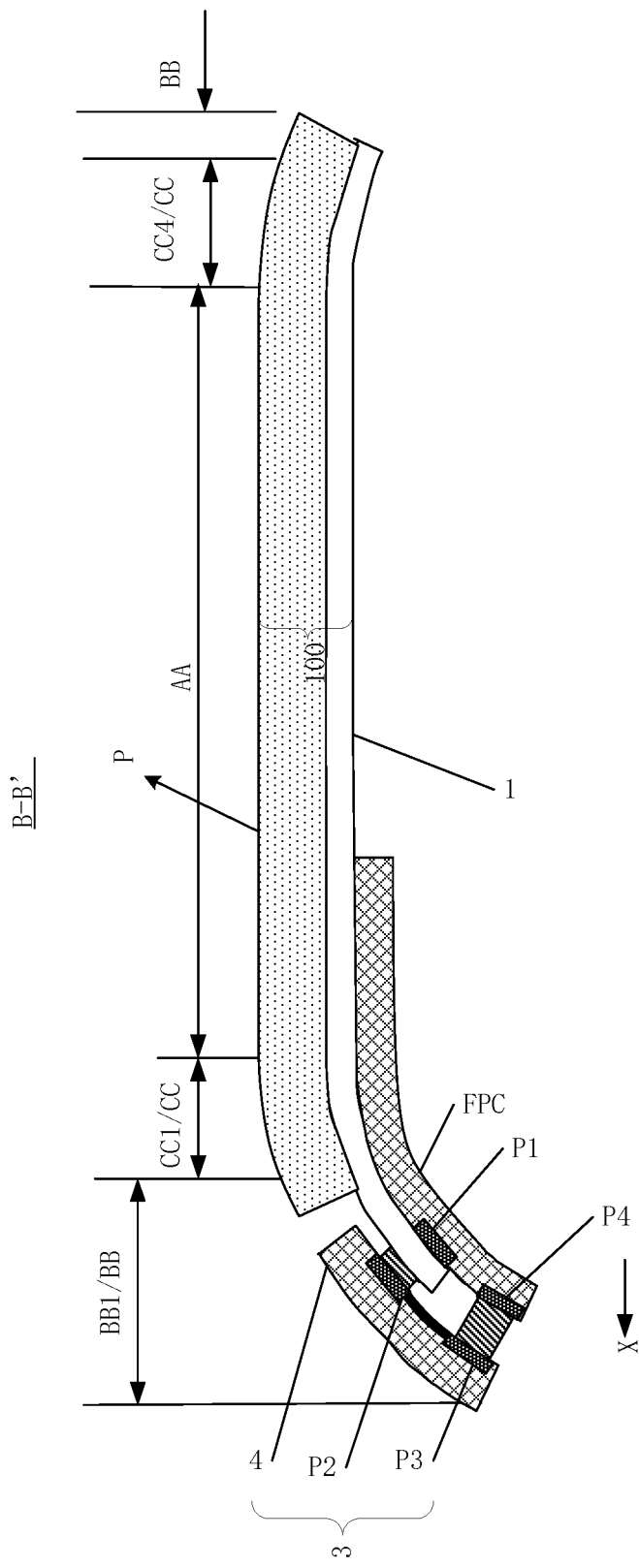
FIG. 16 illustrates a B-B'-sectional view in FIG. 15.
Figure 17:
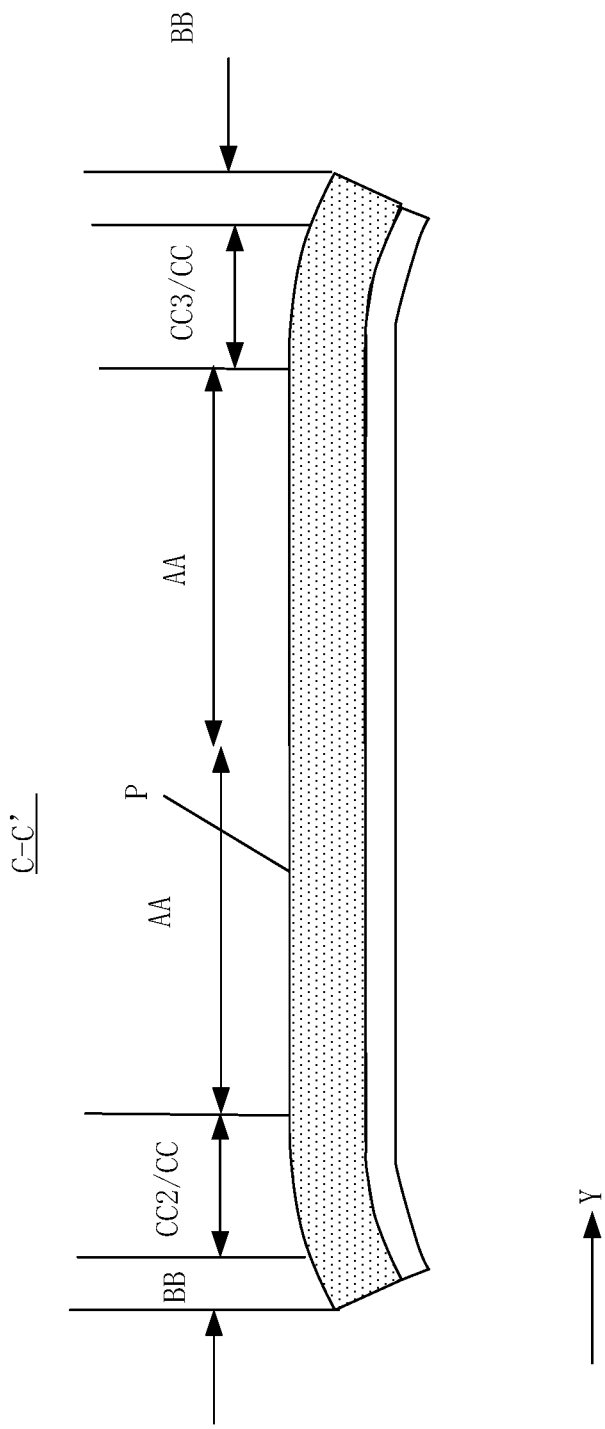
FIG. 17 illustrates a C-C'-sectional view in FIG. 15.

FIG. 15 is a schematic top view of another exemplary display module consistent with various disclosed embodiments of the present disclosure. FIG. 16 is a B-B'-sectional view in FIG. 15. FIG. 17 is a C-C'-sectional view in FIG. 15. As shown in FIG. 15, the auxiliary display area CC may further include a second auxiliary display area CC2, a third auxiliary display area CC3, and a fourth auxiliary display area CC4. Along the first direction X, the first auxiliary display area CC1 and the fourth auxiliary display area CC4 may be located at two sides of the main display area AA, respectively. Along the second direction Y, the second auxiliary display area CC2 and the third auxiliary display area CC3 may be located at two sides of the main display area AA, respectively. The second direction Y may intersect the first direction X.

The display module 000 in this embodiment is a four-section curved screen with four curved sides. In particular, the display module 000 may include the first auxiliary display area CC1, the second auxiliary display area CC2, the third auxiliary display area CC3, and the fourth auxiliary display area CC4. It can be seen from FIG. 16 and FIG. 17 that the first auxiliary display area CC1, the second auxiliary display area CC2, the third auxiliary display area CC3, and the fourth auxiliary display area CC4 may all be bent along a direction away from the light-emitting surface P. The four-section curved screen may increase the display area of the display module. The main display area AA and the auxiliary display area CC may all be able to display, and the customer's visual experience may be enhanced.

Figure 18:
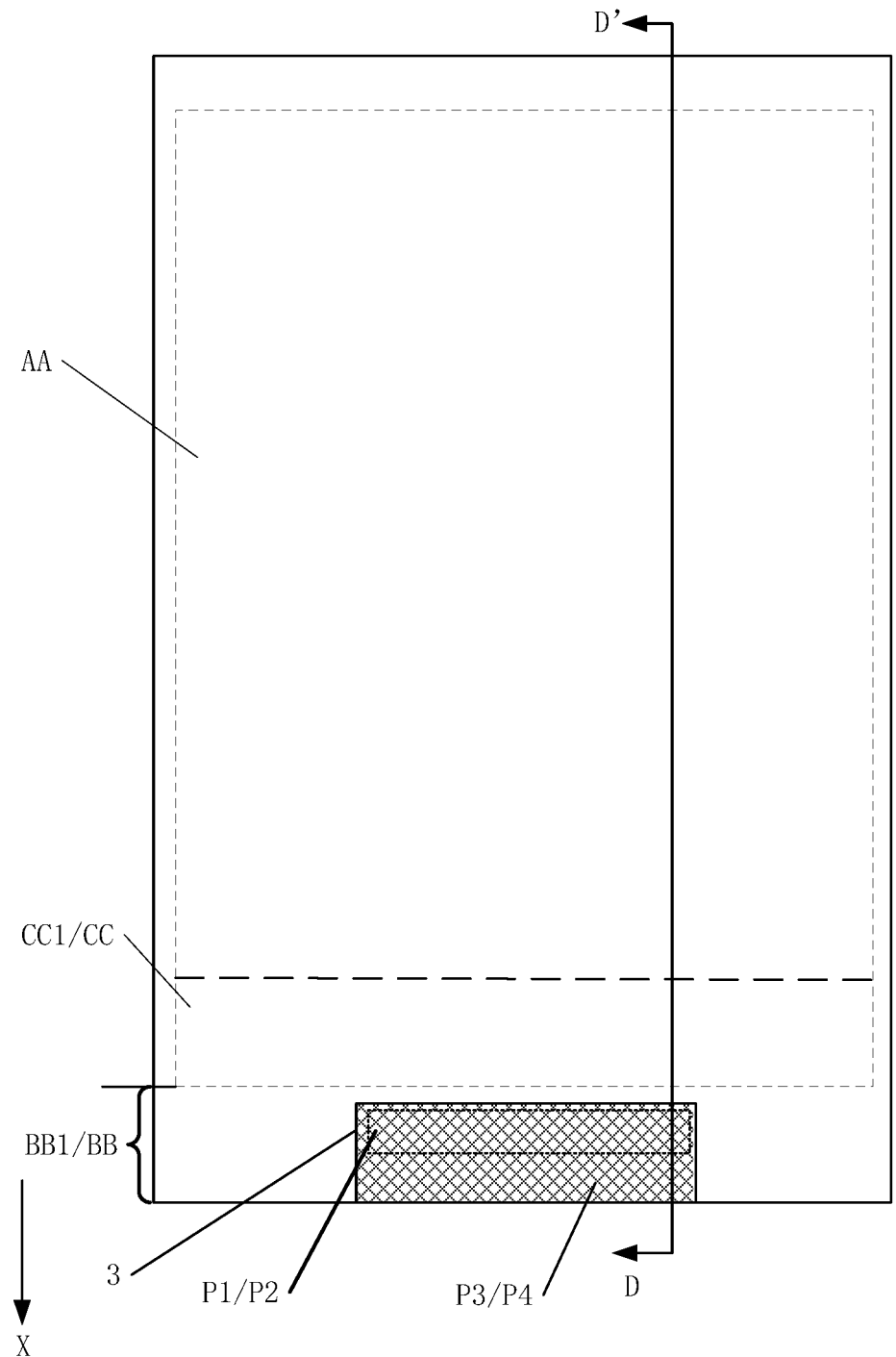
FIG. 18 illustrates a top view of another exemplary display module consistent with various disclosed embodiments of the present disclosure.
Figure 19:
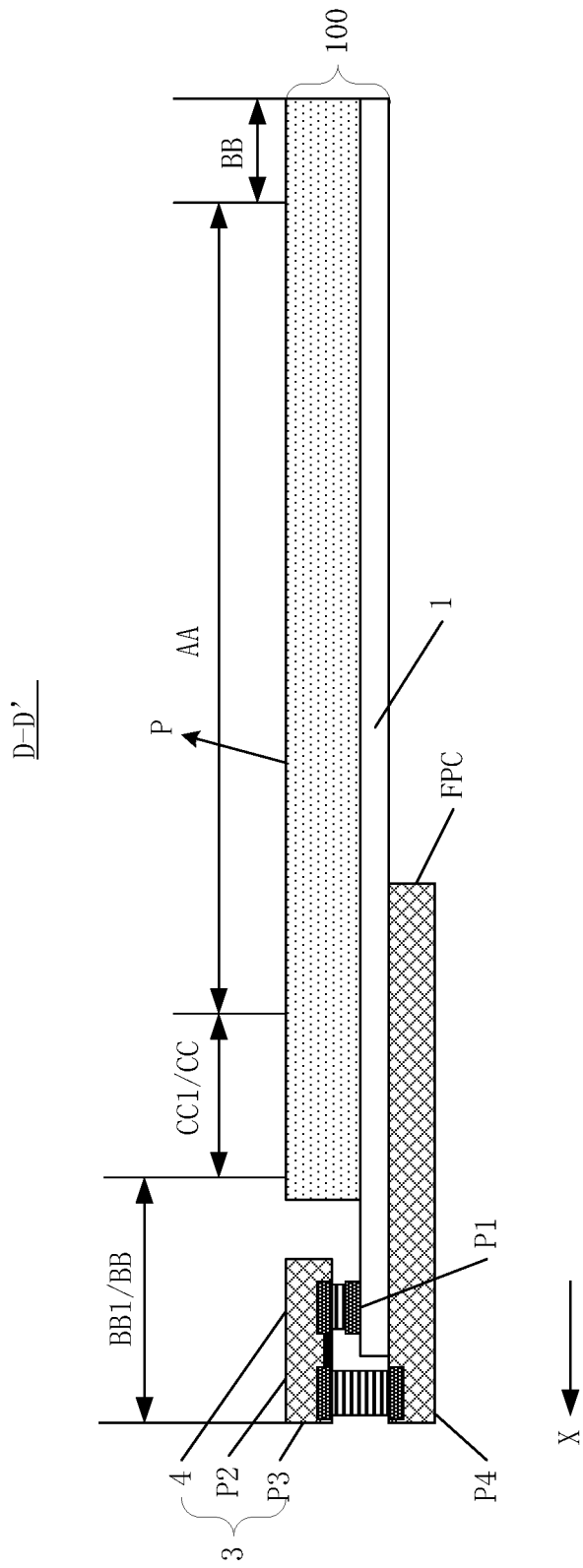
FIG. 19 illustrates a D-D'-sectional view in FIG. 18.

FIG. 18 is a schematic top view of another exemplary display module consistent with various disclosed embodiments of the present disclosure. FIG. 19 is a D-D'-sectional view in FIG. 18. As shown in FIGS. 18-19, the main display area AA and the auxiliary display area CC of the display module 000 may both be flat display areas.

It can be understood that the adapter component 3 provided in the present disclosure may be applicable to any type of display module. In particular, the adapter component 3 may be applicable to a flat display module or a curved display module.

The auxiliary display area CC and the main display area AA together may display a complete picture. The flat display module may not need to be bent; and may meet the needs of specific display scenarios.

Figure 20:
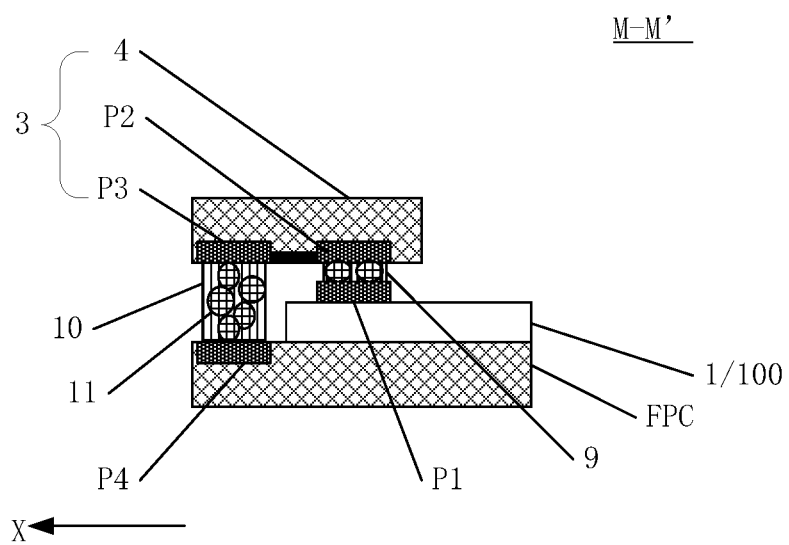
FIG. 20 illustrates an M-M'-sectional view in FIG. 4.

FIG. 20 is another M-M'-sectional view in FIG. 4. As shown in FIG. 20, the first pads P1 and the second pads P2 may be electrically connected through a first conductive adhesive film 9. The third pads P3 and the fourth pads P4 may be electrically connected through a second conductive adhesive film 10. The first conductive adhesive film 9 and the second conductive adhesive film 10 may all include conductive particles 11.

When manufacturing the display module, the first conductive adhesive film 9 may be coated on the first pads P1, and the second conductive adhesive film 10 may be coated on the fourth pad P4. During the coating process, the adjacent first pads P1 may be insured to be insulated to each other and the adjacent fourth pads P4 may be ensured to be insulated to each other. Then, the adapter component 3 may be aligned with the display panel 100 and the first flexible circuit board FPC. The adapter component 3 may be boned with the display panel 100 and the first flexible circuit board FPC, respectively. During the bonding process, the conductive particles in the first conductive adhesive film 9 and the second conductive adhesive film 10 may be crushed. Thus, the first pads P1 and the second pads P2 may be electrically connected, and the third pads P3 and fourth pads P4 may be electrically connected.

It should be noted that, in other embodiments, the electrical connections between the first pads P1 and the second pads P2, and the electrical connections between the third pads P3 and the fourth pads P4 may also be realized by other materials that have a bonding effect and can conduct electricity, based on actual needs.

The first conductive adhesive film 9 and the second conductive adhesive film 10 in the present disclosure may be anisotropic conductive films (ACFs). The anisotropic conductive films may have excellent conductive properties and water resistance. Further, compared with conductive gold balls, the cost of the ACF may be lower.

Figure 21:
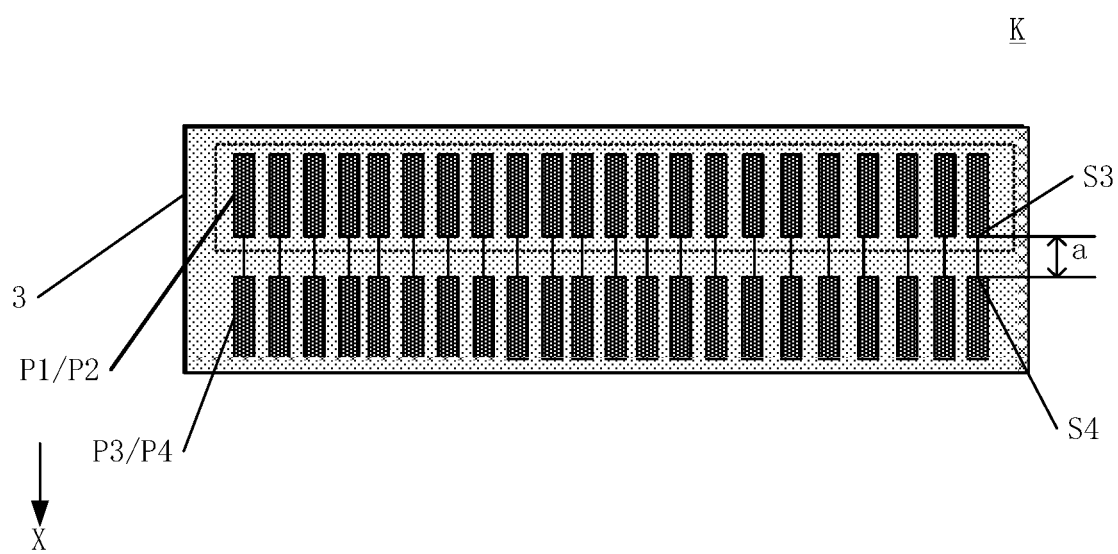
FIG. 21 illustrates a partially enlarged view of the region K in FIG. 4.
Figure 22:
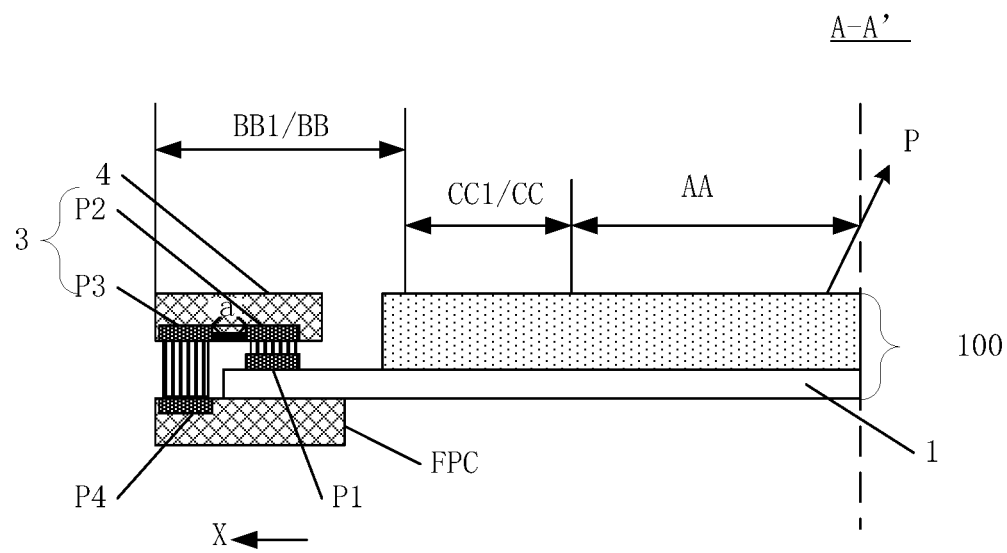
FIG. 22 is zoomed-in view of the region K in FIG. 4

FIG. 21 is a partially enlarged view of the region K in FIG. 4, and FIG. 22 is another A-A'-sectional view in FIG. 4. As shown in FIG. 22, the minimum distance between the second pad P2 and the third pad P3 may be referred to a first distance "a"; and $0.3 \text{ mm} \leq a \leq 0.4 \text{ mm}$.

As shown in FIG. 21, along the first direction X, the second pads P2 and the third pads P3 may be in one-to-one correspondence. Every second pad P2 may have an edge S3 on the side adjacent to the third pad P3, and every third pad P3 may have an edge S4 adjacent to the second pad P2. The minimum distance between the edge S3 and the edge S4 may be the first distance "a". It can also be seen from FIG. 22 the minimum distance "a" between the second pad P2 and the third pad P3.

The minimum distance between the second pad P2 and the third pad P3 may be between 0.3 mm and 0.4 mm. Such a range may ensure that the second pads P2 and the third pads P3 may have enough space for wirings between them to ensure that the second pads P2 and the third pads P3 may be electrically connected in one-to-one correspondence.

In some embodiments, the display module 000 may include a liquid crystal display module, or an OLED display module. The display module of the present disclosure is applicable to both the liquid crystal display modules and the OLED display modules.

Figure 23:
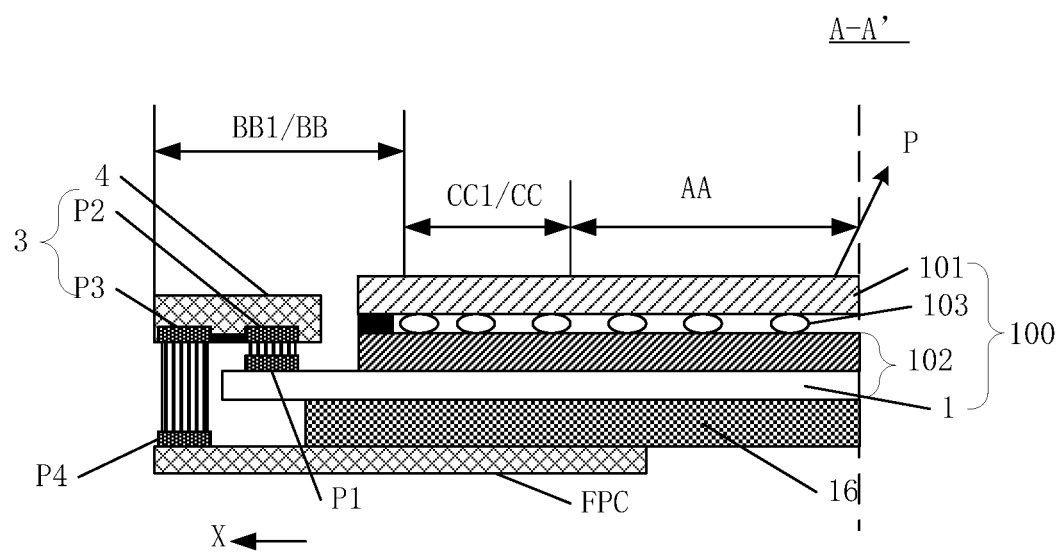
FIG. 23 illustrates another A-A'-sectional view in FIG. 4.

FIG. 23 illustrates another A-A'-sectional view in FIG. 4. As shown in FIG. 23, when the display module 000 is a liquid crystal display module, the display panel 100 may be a liquid crystal display panel. The liquid crystal display panel 100 may include a color film substrate 101, an array substrate 102, and liquid crystal molecules interposed between the color filter substrate 101 and the array substrate 102. The liquid crystal display module may also include film layers, such as a lower polarizer disposed on the side of the array substrate 102 away from the color filter substrate 101, and an upper polarizer disposed on the side of the color film substrate 101 away from the array substrate 102 (not shown). The display module may also include a backlight module 16 opposing to the liquid crystal display panel 100. The backlight module 16 may be located on the side of the substrate 1 away from the light-emitting surface. The backlight module 16 may include a light-emitting unit that provides backlight for the liquid crystal display panel 100. The array substrate 102 may include a substrate 1 and an array layer on the side of the substrate 1 away from the flexible circuit board FPC. The liquid crystal display panel may have the advantages of low cost, low power consumption, and soft picture, etc. Because the display module of the present disclosure may utilize the adapter component 3, there may be no need to bend the flexible circuit board at a large angle. The flexible circuit board FPC may be electrically connected to the display panel through the adapter component 3. Thus, the display failure caused by the disconnection of the wirings during the large angle bending of the flexible circuit board may be prevented.

Figure 24:
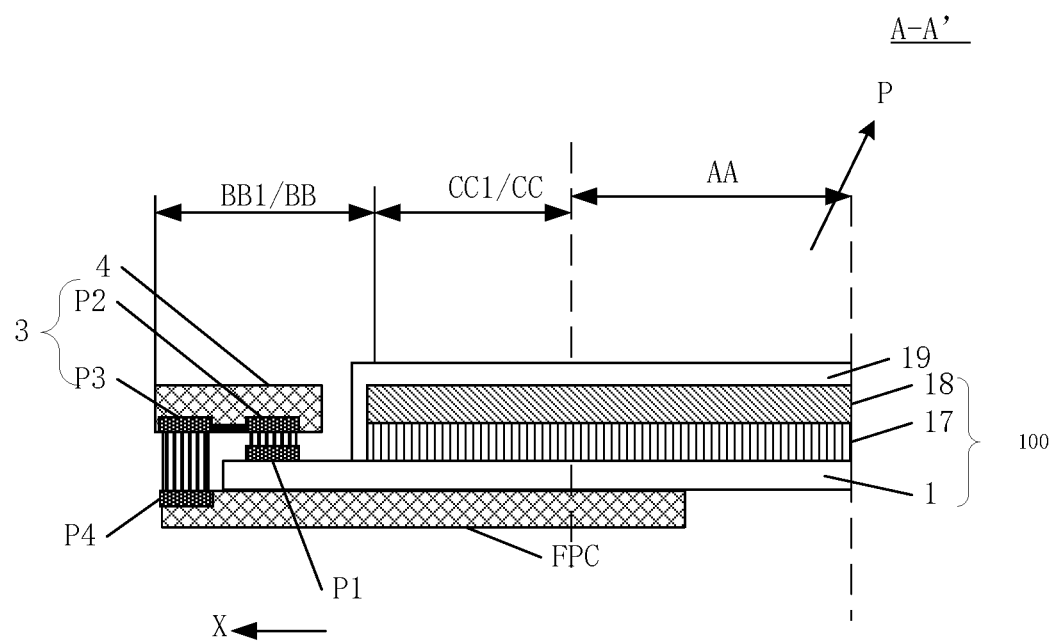
FIG. 24 illustrates another A-A'-sectional view in FIG. 4.

FIG. 24 illustrates another exemplary A-A'-sectional view in FIG. 4. As shown in FIG. 24, when the display module is an OLED display module, the display panel 100 may be an OLED display panel. The OLED display panel may include an array layer 17, a display layer 18, and an encapsulation layer 19 sequentially stacked on the side of the substrate adjacent to the light-emitting surface. The array layer 17 may include circuits, such as thin-film transistors (not shown), etc. The display layer 18 may include an anode metal layer, an organic light-emitting layer, and a cathode metal layer (not shown). The anode metal layer may include a plurality of anodes, and the cathode metal layer may include a cathode. The encapsulation layer 19 may be used to encapsulate the display panel to prevent the display panel from being corroded by water and oxygen to cause the display to fail. It can be understood that the OLED display module may be self-luminous, and may have the advantages of light and thin, high contrast, large viewing angle, short response time, and high luminous efficiency, etc. For the OLED display module, the electrical connection between the flexible circuit board FPC and the display panel may also be achieved through the adapter component 3 to prevent the flexible circuit board from being broken during a large angle bending process to cause the display failure.

Figure 25:
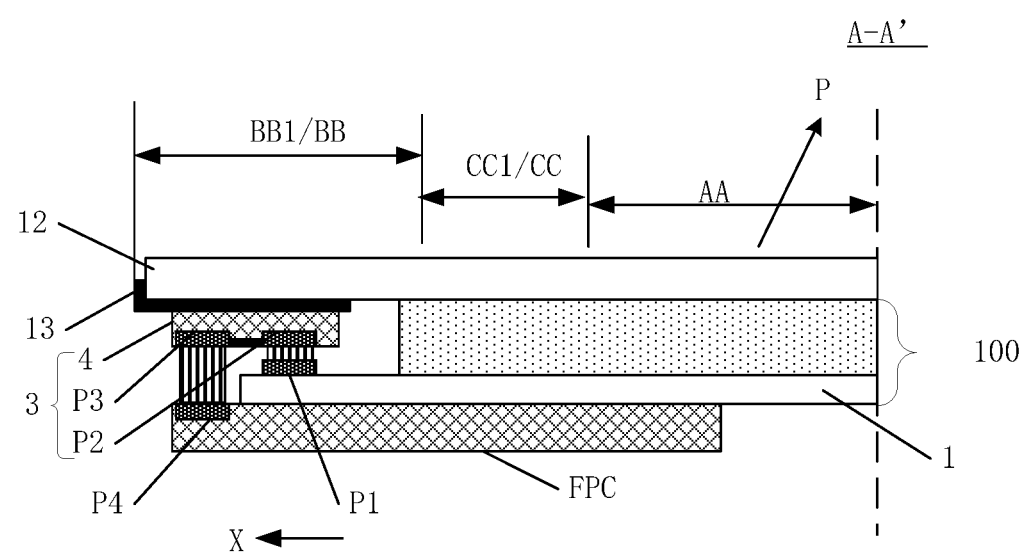
FIG. 25 illustrates another A-A'-sectional view in FIG. 4.
Figure 26:
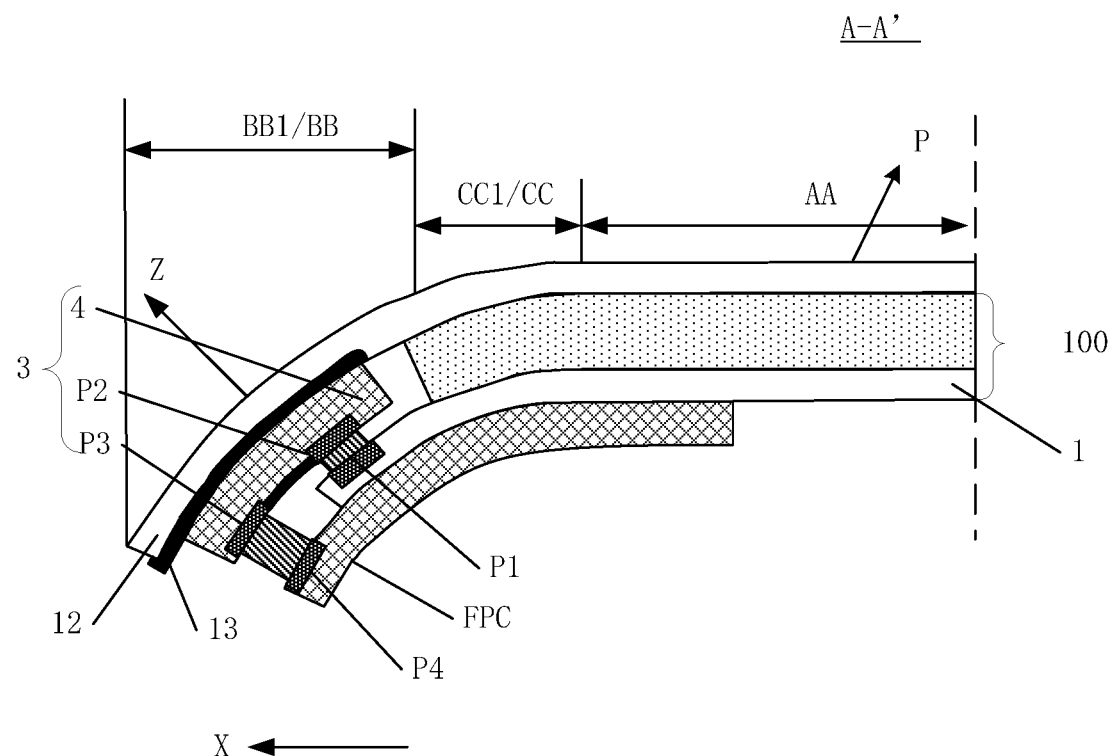
FIG. 26 illustrates the structure in FIG. 25 under a bent state.

FIG. 25 illustrates another A-A'-sectional view in FIG. 4, and FIG. 26 is a schematic view of the structure in FIG. 25 under a bent state. As shown in FIGS. 25-26, the display module 000 may further include a cover glass 12. The cover glass 12 may be disposed on the side of the display panel 100 away from the flexible circuit board, and a light-shielding layer 13 may be disposed on the side of the cover glass 12 adjacent to the display panel 100 in the first non-display area BB1.

The material of the light-shielding layer 13 may be ink. The cover glass 12 is not pattern-filled in FIGS. 25-26. The material of the cover glass 12 may be glass.

FIG. 25 illustrates the display module at a flat state. It can be understood that, along a direction perpendicular to the plane of the substrate 1, the projection of the adapter component 3 may be located in the projection of the light-shielding layer 13, and the light-shielding layer 13 may completely cover the adapter component 3. FIG. 26 illustrates the module under a bent status. Along the Z direction referring to the normal direction at any point in the curved surface, the light-shielding layer 13 may also cover the adapter component 3. The light-shielding layer 13 may effectively prevent the occurrence of light leakage in the first non-display area BB1.

Figure 27:
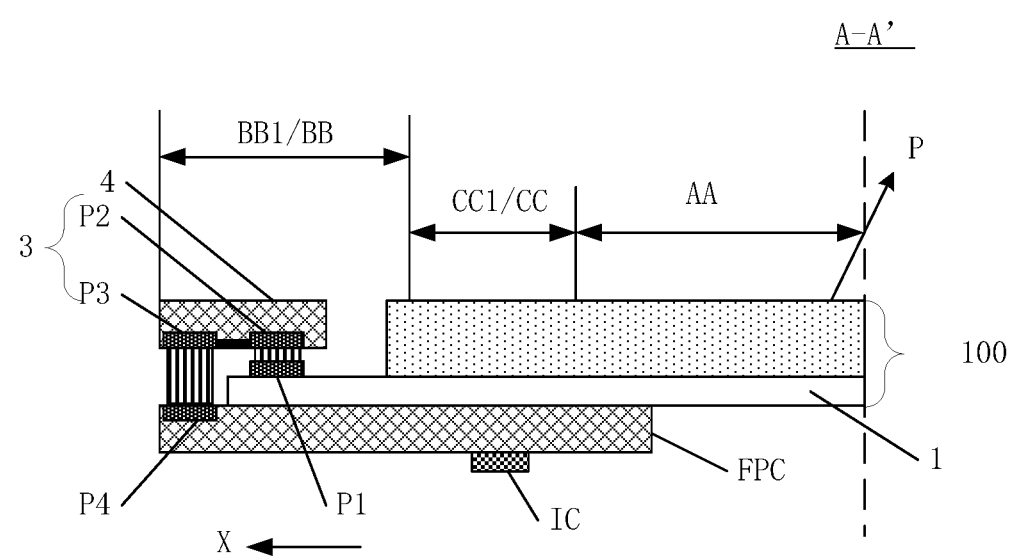
FIG. 27 illustrates another A-A'-sectional view in FIG. 4.

FIG. 27 illustrates another A-A'-sectional view in FIG. 25. As shown in FIG. 25, a driving chip IC may be disposed at the side of the flexible circuit board FPC away from the substrate 1.

The driving chip IC may be configured to provide an analog signal for the display panel to drive the display screen of the display panel. The driving chip IC may be disposed on the side of the flexible circuit board FPC away from the substrate 1. Such an approach may not require the driving chip IC to be bonded to the display panel 100; and it may be advantageous to realize a narrow bezel.

In some embodiments, referring to FIGS. 5-6, the second pad P2 and the third pad P3 may be electrically connected by a metal wiring 14.

In other embodiments, the second pads P2 and the third pads P3 may be electrically connected to each other through metal wirings in one-to-one correspondence. The second pads P2 and the third pads P3 may also be electrically connected to each other in other ways.

The metal wirings may be formed by first forming a metal layer on the flexible substrate 4 and then manufacturing the metal wirings through development and etching processes. The metal wirings 14 may achieve a relatively high precision during the manufacturing process, which may satisfy the requirements for the electrical connections between the second pads P2 and the third pads P3. Further, the metal wirings 14 may also be able to ensure that short-circuit may not occur between the second pads P2 and the adjacent third pads P3.

Figure 28:
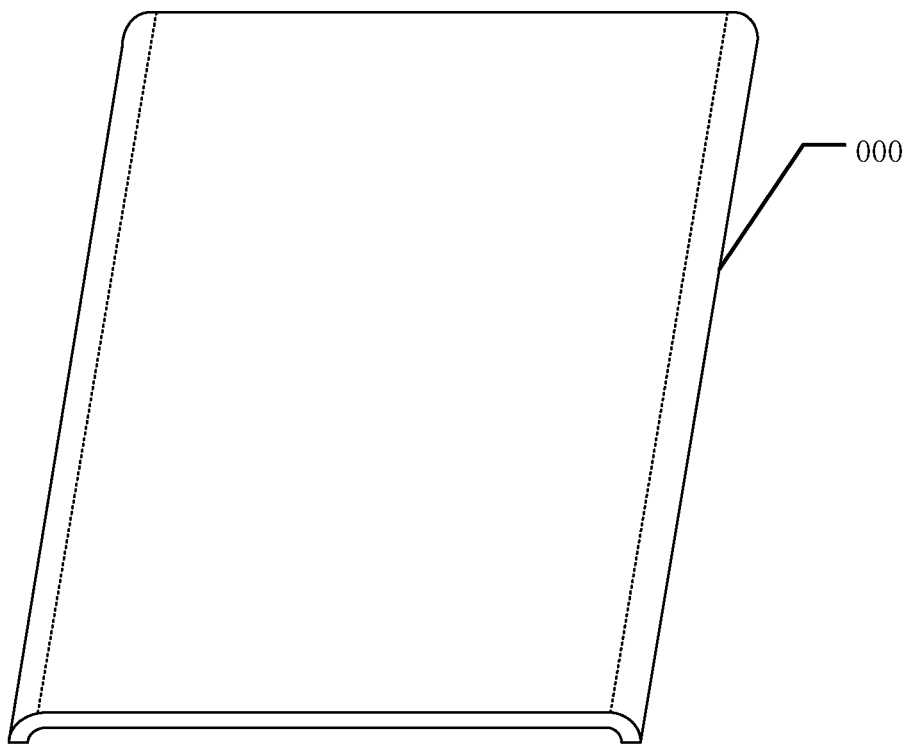
FIG. 28 illustrates an exemplary display device consistent with various disclosed embodiments of the present disclosure.
Figure 29:
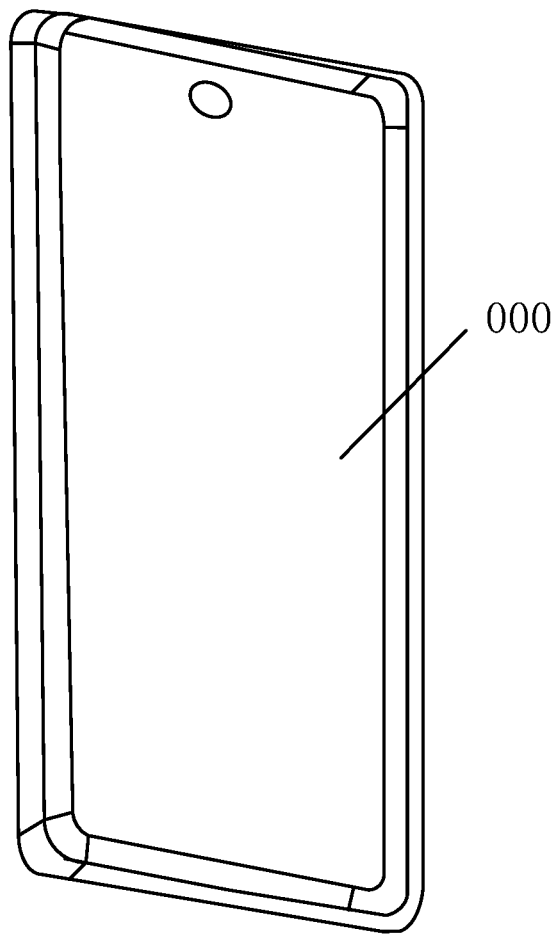
FIG. 29 illustrates another exemplary display device consistent with various disclosed embodiments of the present disclosure.

The present disclosure also provides a display device. FIG. 28 illustrates an exemplary display device consistent with various disclosed embodiments of the present disclosure. FIG. 29 illustrates another exemplary display device consistent with various disclosed embodiments of the present disclosure. As show in FIGS. 28-29, the provided display device 200 may include the display module 000. The display module 000 may be the display module described in the above embodiments, or other appropriate display modules. In one embodiment, as shown in FIG. 28, the display device 200 is two-curved screen device. In particular, the two sides of the display device may be curved surfaces. In another embodiment, as shown in FIG. 29, the display device 200 may be four-curved screen device. In particular, the four sides of the display device may be curved surfaces.

For illustrative purposes, the embodiments of FIG. 28 and FIG. 29 only use a mobile phone as an example to describe the display device 200. It can be understood that the display device 200 provided by the embodiments of the present disclosure may be other devices having a display function, such as a computer, a TV, an electronic paper, or a car display device, etc. The function of the display device 200 is not specifically limited by the present invention. The display device 200 provided by the embodiments of the present device may have the beneficial effects of the display module 000 provided by the embodiments of the present disclosure. For details, reference may be made to the specific description of the display module 000 in the foregoing embodiments.

It should be noted that the technical features in the embodiments provided by the present disclosure can be freely combined without conflict, and the present disclosure will not be exhaustive.

It can be known from the foregoing embodiments that the display module and the display device provided by the present disclosure may achieve at least the following beneficial effects.

The display module and the display device of the present disclosure are provided with an adapter component. The adapter component may include a flexible substrate, a plurality of mutually insulated second pads, and a plurality of mutually insulated third pads. The second pads and the third pads may be located on the side of the flexible substrate adjacent to the substrate of the display panel; and the second pads may be located on the side of the third pads adjacent to the main display area of the display panel. The second pads may be electrically connected to the third pads in one-to-one correspondence. The second pads may be electrically connected to the first pads in the first non-display area of the display panel in one-to-one correspondence. The third pads may be electrically connected to the fourth pads on the flexible circuit board in one-to-one correspondence. In the present disclosure, the connection of the signal lines of the display panel and the flexible circuit board may be realized by providing an adapter component, the large angle bending of the flexible substrate or the flexible circuit board may be avoided. Accordingly, the problem of the disconnection of wirings may be reduced, and the display reliability may be improved.

Although some specific embodiments of the present disclosure have been described in detail through examples, those skilled in the art should understand that the above examples are only for illustration, not for limiting the scope of the present disclosure. Those skilled in the art should understand that the above embodiments can be modified without departing from the scope and spirit of the present invention. The scope of the invention is defined by the appended claims.

What is claimed is:

1. A display module, comprising:
   a main display area, an auxiliary display area, and a non-display area, wherein the auxiliary display area includes a first auxiliary display area, the non-display area includes a first non-display area, and the main display area, the first non-display area, and the first auxiliary display area are arranged along a first direction;
   a light-emitting surface;
   a display panel, wherein the display panel includes a substrate, a plurality of first pads are mutually insulated and disposed on a side of the substrate adjacent to the light-emitting surface, and the plurality of first pads are disposed in the first non-display area;
   an adapter component, wherein the adapter component is disposed on a side of the substrate adjacent to the light-emitting surface and in the first non-display area, the adapter component includes a flexible substrate, a plurality of second pads that are mutually insulated and a plurality of third pads that are mutually insulated, the plurality of second pads and the plurality of third pads are all disposed on a side of the flexible substrate adjacent to the substrate, and the plurality of second pads are disposed on a side of the plurality of third pads adjacent to the main display area; and
   a flexible circuit board, wherein the flexible circuit board is disposed on a side of the substrate away from the light-emitting surface, and the flexible circuit board in the first non-display area includes a plurality of fourth pads that are mutually insulated,
   wherein the plurality of first pads and the plurality of second pads are electrically connected in one-to-one correspondence, the plurality of second pads and the plurality of third pads are electrically connected in one-to-one correspondence, and the plurality of third pads and the plurality of fourth pads are electrically connected in one-to-one correspondence.

2. The display module according to claim 1, further comprising:
   a protective layer,
   wherein:
   the protective layer is disposed on the side of the substrate away from the light-emitting surface; and
   the flexible circuit board is bonded to a side of the protective layer away from the display panel.

3. The display module according to claim 2, further comprising:
   a first buffer layer,
   wherein:
   the first buffer layer is disposed on the side of protective layer away from the substrate; and
   the flexible circuit board and the first buffer layer are disposed on a same layer and have a first gap therebetween.

4. The display module according to claim 3, wherein:
   the flexible circuit board has a first thickness;
   the first buffer layer has a second thickness; and
   the first thickness is smaller than, or equal to the second thickness.

5. The display module according to claim 2, wherein:
   a material of the protective layer includes one of polyimide or polyethylene terephthalate.

6. The display module according to claim 3, wherein:
   a material of the buffer layer includes foam.

7. The display module according to claim 1, wherein:
   the flexible circuit board includes a first sub-portion and a second sub-portion;
   the first sub-portion is located in the first non-display area;
   the plurality of fourth pads are disposed on a side of first sub-portion adjacent to the light-emitting surface; and
   the second sub-portion is located in the main display area and the auxiliary display area.

8. The display module according to claim 7, wherein:
   a second buffer layer is disposed on a side of the second sub-portion away from the substrate.

9. The display module according to claim 8, wherein:
   a material of the second buffer layer includes foam.

10. The display module according to claim 1, wherein:
    the auxiliary display area is bent in a direction away from the light-emitting surface.

11. The display module according to claim 10, wherein:
    the auxiliary display area further includes a second auxiliary display area, a third auxiliary display area and a fourth auxiliary display area;
    along the first direction, the first auxiliary display area and the fourth auxiliary display area are located at two sides of the main display area, respectively;

along a second direction, the second auxiliary display area and the third auxiliary display area are located at two sides of the main display area, respectively; and the first direction intersects the second direction.

12. The display module according to claim 1, wherein:
the main display area and the auxiliary display area are all flat display areas.

13. The display module according to claim 1, wherein:
the plurality of first pads and the plurality of second pads are electrically connected by a first conductive adhesive film;
the plurality of third pads and the plurality of fourth pads are electrically connected by a second conductive adhesive film; and
both the first conductive adhesive film and the second conductive adhesive film include conductive particles.

14. The display module according to claim 1, wherein:
a minimum distance between a second pad and a third pad is a first distance "a"; and
0.3 mm≤a≤0.4 mm.

15. The display module according to claim 1, wherein:
a material of the flexible substrate includes one of polyimide or polyethylene terephthalate.

16. The display module according to claim 1, wherein:
the display module includes one of a liquid crystal display module, or an organic light-emitting diode (OLED) display module.

17. The display module according to claim 1, further comprising:
a cover glass,
wherein:
the cover glass is disposed on a side of the display panel away from the flexible circuit board; and
in the first non-display area, a light-shielding layer is disposed on a side of the cover glass adjacent to the display panel.

18. The display module according to claim 1, wherein:
a driving chip is disposed on a side of the flexible circuit board away from the substrate.

19. The display module according to claim 1, wherein:
the plurality of second pads and the plurality of third pads are electrically connected through metal wirings.

20. A display device, comprising:
a display module, including:
a display panel, wherein the display panel includes a substrate, a plurality of first pads are mutually insulated and disposed on a side of the substrate adjacent to the light-emitting surface, and the plurality of first pads are disposed in the first non-display area;
an adapter component, wherein the adapter component is disposed on a side of the substrate adjacent to the light-emitting surface and in the first non-display area, the adapter component includes a flexible substrate, a plurality of second pads that are mutually insulated and a plurality of third pads that are mutually insulated, the plurality of second pads and the plurality of third pads are all disposed on a side of the flexible substrate adjacent to the substrate, and the plurality of second pads are disposed on a side of the plurality of third pads adjacent to the main display area; and
a flexible circuit board, wherein the flexible circuit board is disposed on a side of the substrate away from the light-emitting surface, and the flexible circuit board in the first non-display area includes a plurality of fourth pads that are mutually insulated,
wherein the plurality of first pads and the plurality of second pads are electrically connected in one-to-one correspondence, the plurality of second pads and the plurality of third pads are electrically connected in one-to-one correspondence, and the plurality of third pads and the plurality of fourth pads are electrically connected in one-to-one correspondence.

* * * * *